United States Patent
Yamazaki et al.

(10) Patent No.: US 6,605,497 B2
(45) Date of Patent: *Aug. 12, 2003

(54) METHOD OF MANUFACTURING SEMICONDUCTOR DEVICE OVER GLASS SUBSTRATE HAVING HEAT RESISTANCE

(75) Inventors: Shunpei Yamazaki, Tokyo (JP); Hisashi Ohtani, Kanagawa (JP)

(73) Assignee: Semiconductor Energy Laboratory Co., Ltd., Kanagawa-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 13 days.

(21) Appl. No.: 09/173,567

(22) Filed: Oct. 16, 1998

(65) Prior Publication Data

US 2002/0040981 A1 Apr. 11, 2002

(30) Foreign Application Priority Data

Oct. 17, 1997 (JP) .............................................. 9-303526
Oct. 17, 1997 (JP) .............................................. 9-303527
May 21, 1998 (JP) ........................................... 10-156719

(51) Int. Cl.$^7$ ............................................... H01L 21/84
(52) U.S. Cl. ..................................... 438/166; 438/486
(58) Field of Search ................................. 438/166, 404, 438/413, 486, 149

(56) References Cited

U.S. PATENT DOCUMENTS 3,484,311 A * 12/1969 Benzing ...................... 438/488
4,180,618 A * 12/1979 Alpha et al. ................. 428/428

(List continued on next page.)

FOREIGN PATENT DOCUMENTS

| JP | 06-265940 | 9/1994 |
| JP | 07-130652 | 5/1995 |
| JP | 07-135318 | 5/1995 |
| JP | 07-321339 | 12/1995 |
| JP | 08-078329 | 3/1996 |
| JP | 08-139019 | 5/1996 |
| JP | 08-250744 | 9/1996 |

OTHER PUBLICATIONS

Specifications and Drawings for Application Ser. No. 09/953,483, "Substrate of Semiconductor Device and Fabrication Method Thereof as well as Semiconductor Device and Fabrication Method Thereof".

Ohtani et al., "LP–B: Late–News Poster: A 60–in. HDTV Rear–Projector with Continuous–Grain Silicon Technology", May 17–22, 1998, pp. 467–470, SID 98 Digest International Symposium Digest of Technical Papers, vol. XXIX.

Ryuichi Shimokawa et al., "Characterization of High–Efficiency Cast–Si Solar Cell Wafers by MBIC Measurement", May 1988, pp. 751–758, Japanese Journal of Applied Physics vol. 27 No. 5.

*Primary Examiner*—Wael Fahmy
*Assistant Examiner*—Anh Duy Mai
(74) *Attorney, Agent, or Firm*—Eric J. Robinson; Robinson Intellectual Property Law Office, P.C.

(57) ABSTRACT

When a crystalline semiconductor thin film formed by using a catalytic element for facilitating crystallization is subjected to a heat treatment in an atmosphere containing a halogen element at a temperature exceeding 700° C., a crystal structure in which crystal grain boundaries do not substantially exist can be obtained. In the present invention, the foregoing crystalline semiconductor thin film is formed on a crystallized glass substrate which is inexpensive and has high heat resistance, so that an inexpensive semiconductor device can be provided.

50 Claims, 19 Drawing Sheets

THERMAL OXIDATION PROCESS

CRYSTALLIZATION PROCESS

U.S. PATENT DOCUMENTS

| | | | |
|---|---|---|---|
| 4,915,772 A | * 4/1990 | Fehlner et al. | 117/44 |
| 5,412,493 A | 5/1995 | Kunii et al. | |
| 5,422,287 A | * 6/1995 | So | 438/165 |
| 5,643,826 A | 7/1997 | Ohtani et al. | |
| 5,648,277 A | 7/1997 | Zhang et al. | |
| 5,882,960 A | 3/1999 | Zhang et al. | |
| 5,895,933 A | 4/1999 | Zhang et al. | |
| 5,923,962 A | 7/1999 | Ohtani et al. | |
| 5,923,968 A | 7/1999 | Yamazaki et al. | |
| 6,291,837 B1 | 9/2001 | Nakajima et al. | 257/57 |

* cited by examiner

THERMAL OXIDATION PROCESS

CRYSTALLIZATION PROCESS

THERMAL OXIDATION PROCESS

CRYSTALLIZATION PROCESS

GETTERING PROCESS OF CATALYTIC ELEMENT

PHOSPHORUS ADDITION PROCESS

BORON ADDITION PROCESS

PHOSPHORUS ADDITION PROCESS

BORON ADDITION PROCESS

PHOSPHORUS ADDITION PROCESS

GETTERING PROCESS

COOLING PERIOD (a)

COOLING PERIOD (b)

METHOD OF MANUFACTURING SEMICONDUCTOR DEVICE OVER GLASS SUBSTRATE HAVING HEAT RESISTANCE

BACKGROUND OF THE INVENTION

1. Field of the Invention

The present invention relates to a semiconductor device using a crystalline semiconductor thin film formed on a substrate having an insulating surface.

Incidentally, in the present specification, any of a thin film transistor (hereinafter referred to as a TFT), a semiconductor circuit, an electrooptical device, and an electronic equipment are included in the category of the semiconductor device. That is, any device capable of functioning by using semiconductor characteristics will be referred to as the semiconductor device.

Thus, the semiconductor device recited in claims of the present application includes not only a single component, such as a thin film transistor, but also a semiconductor circuit or an electrooptical device formed by integrating such single components, and further, an electronic equipment having those as parts.

2. Description of the Related Art

In recent years, attention has been paid to a technique for constructing a thin film transistor (TFT) by using a semiconductor thin film (its thickness is about several tens to several hundreds nm) formed on a substrate having an insulating surface. With respect to the thin film transistor, the development thereof particularly as a switching element for an image display device (for example, a liquid crystal display device: LCD) has been hastened.

For example, in the liquid crystal display device, trials have been made to apply TFTs to any electric circuit, such as a pixel matrix circuit for individually controlling pixel regions arranged in matrix, a driving circuit for controlling the pixel matrix circuit, and a logic circuit (calculation circuit, memory circuit, clock generator, etc.) for processing data signals from the outside.

In the present circumstances, although a TFT using a noncrystalline silicon film (amorphous silicon film) as an active layer is put to practical use, a TFT using a crystalline silicon film (polysilicon film or the like) is necessary for an electric circuit required the performance of further high speed operation, such as a driving circuit or a logic circuit.

Conventionally, high temperature annealing has been required to form a polycrystalline silicon film having high crystallinity. Such a polycrystalline silicon film is generally referred to as high temperature polysilicon. For the purpose of forming the high temperature polysilicon film, it is necessary to prepare a substrate having high heat resistance so that the substrate can withstand a process temperature near 1000° C. For that reason, in the present circumstances, a quartz substrate (according to circumstances, a silicon substrate) is used.

However, the quartz substrate has a high unit cost, so that the quartz substrate has problems of increasing the cost of manufacture, and further, increasing the cost of a product. Thus, in recent years, attention has been paid to a low temperature polysilicon film formed on an inexpensive glass substrate, and the research of the high temperature polysilicon film has been gradually declined.

The coefficient of thermal expansion of the quartz substrate is about $0.48 \times 10^{-6}$ °C.$^{-1}$, which is as small as about $\frac{1}{10}$ of the coefficient of thermal expansion of silicon (about $4.15 \times 10^{-6}$ °C.$^{-1}$). That is, stress is apt to occur between the quartz substrate and silicon, and peeling (film peeling) of silicon or the like is apt to occur at a heat treatment.

Moreover, since it is difficult to make the quartz substrate large, the use of a TFT using the high temperature polysilicon is limited to a liquid crystal display device with a size of about 1 to 2 inches in diagonal for a projection type projector or the like. That is, there is a problem that such a TFT can not be used for display devices of the several tens inch class, such as a display for a note-sized personal computer.

As a method of forming a crystalline silicon film on a glass substrate, there are known techniques disclosed in Japanese Patent Unexamined Publication No. Hei. 7-130652 and No. Hei. 8-78329 by the same assignee as the present application. The techniques disclosed in these publications use a catalytic element for facilitating crystallization of an amorphous silicon film, so that the formation of the crystalline silicon film having excellent crystallinity can be made by a heat treatment at about 500 to 600° C. and for about 4 hours.

Particularly, the technique disclosed in Japanese Patent Unexamined Publication No. Hei. 8-78329 makes crystal growth almost parallel to the substrate surface by applying the above technique. The present inventors et al. refer to the formed crystallized region particularly as a horizontal growth region (or lateral growth region).

However, even if a driving circuit is constructed by using such TFTs, the circuit does not still reach the state in which the required performance is completely satisfied. Particularly, in the present circumstances, it is impossible to construct a high speed logic circuit requiring an extremely high speed operation ranging from megahertz to gigahertz by conventional TFTS.

The present inventors have repeated various processes of trial and error to improve crystallinity of a crystalline silicon film (called a polysilicon film) including crystal grain boundaries. A semiamorphous semiconductor (Japanese Patent Unexamined Publication No. Sho. 57-160121), a monodomain semiconductor (Japanese Patent Unexamined Publication No. Hei. 8-139019), and the like can be sited.

The common concept of semiconductor films disclosed in the above publications is to make the crystal grain boundaries substantially harmless. That is, the most important object is to substantially eliminate the crystal grain boundaries to cause the movement of carriers (electrons or holes) to smoothly move.

However, it can be said that even the semiconductor film disclosed in the above publications is insufficient to carry out the high speed operation required by a logic circuit. That is, in order to realize a system-on-panel having a built-in logic circuit, the development of a completely novel material is required.

SUMMARY OF THE INVENTION

The present invention has been made in order to satisfy the above requirements, and an object thereof is to realize a semiconductor device having extremely high performance, which can construct such a high speed logic circuit as can not be manufactured by conventional TFTs.

In order to achieve the above object, according to a first aspect of the present invention, a semiconductor device comprises a glass substrate having a distortion point of not lower than 750° C., an insulating silicon film formed on at least a front surface and a back surface of the glass substrate, and a TFT including a channel formation region of a semiconductor thin film made of a collective of a plurality of rod-like or flattened rod-like crystals and formed on the insulating silicon film, and the semiconductor device is characterized in that the plane orientation of the channel formation region is roughly {110} orientation, and not less than 90% of crystal lattices have continuity at crystal grin boundaries.

According to another aspect of the present invention, a semiconductor device comprises a glass substrate having a distortion point of not lower than 750° C., an insulating silicon film formed on at least a front surface and a back surface of the glass substrate, and a TFT including a channel formation region of a semiconductor thin film made of a collective of a plurality of rod-like or flattened rod-like crystals and formed on the insulating silicon film, and the semiconductor device is characterized in that the plane orientation of the channel formation region is roughly {110} orientation, and not less than 90% of lattice stripes observed to cross crystal grain boundaries are linearly continuous between different crystal grains forming the crystal grain boundaries.

According to still another aspect of the present invention, a semiconductor device comprises a glass substrate having a distortion point of not lower than 750° C., an insulating silicon film formed on at least a front surface and a back surface of the glass substrate, and a TFT including a channel formation region of a semiconductor thin film made of a collective of a plurality of rod-like or flattened rod-like crystals and formed on the insulating silicon film, and the semiconductor device is characterized in that an electron beam diffraction pattern observed when the channel formation region is vertically irradiated with an electron beam has regularity peculiar to {110} orientation.

According to still another aspect of the present invention, a semiconductor device comprises a glass substrate having a distortion point of not lower than 750° C., an insulating silicon film formed on at least a front surface and a back surface of the glass substrate, and a TFT including a channel formation region of a crystalline semiconductor thin film formed on the insulating silicon film.

According to still another aspect of the present invention, a semiconductor device comprises a glass substrate having a distortion point of not lower than 750° C., an insulating silicon film formed on at least a front surface and a back surface of the glass substrate, and a TFT including a channel formation region of a high temperature polysilicon film formed on the insulating silicon film.

Still another aspect of the present invention is characterized by comprising a glass substrate having a distortion point of not lower than 750° C., an insulating silicon film formed on at least a front surface and a back surface of the glass substrate, and a TFT including a channel formation region of a crystalline semiconductor thin film formed on the insulating silicon film. Yet another aspect of the present invention is characterized by comprising a glass substrate having a distortion point of not lower than 750° C., an insulating silicon film formed on at least a front surface and a back surface of the glass substrate, and a TFT including a channel formation region of a high temperature polysilicon film formed on the insulating silicon film.

The following three points can be enumerated as the important structural conditions of the present invention.

(1) A glass substrate (glass substrate having a distortion point of not lower than 750° C.) having such heat resistance that the substrate can withstand the temperature of not lower than 750° C. is used as a substrate.

(2) The outer surface (at least the front surface and the back surface, preferably all surfaces) of the high heat-resistant glass substrate is protected with an insulating silicon film.

(3) A crystalline semiconductor thin film excellent in conformity of crystal grain boundary is provided on the high heat-resistant glass substrate covered with the insulating silicon film.

In order to form the crystalline semiconductor thin film excellent in the conformity of crystal grain boundary developed by the present inventors, a heat treatment at a temperature exceeding 700° C. is required. The details of this forming method will be described in the section of "Detailed Description of the Invention".

For the above reason, it is necessary to use a substrate having a distortion point of not lower than 750° C. As such a substrate, although a quartz substrate is common, since the quartz substrate is expensive, the total cost is increased. Moreover, the coefficient of thermal expansion is $0.48 \times 10^{-6}$ $C.^{-1}$, and is as small as about $\frac{1}{10}$ of the coefficient of thermal expansion of silicon (about $4.15 \times 10^{-6}$ $C.^{-1}$). That is, stress is apt to occur between the quartz substrate and silicon, and peeling (film peeling) of silicon or the like is apt to occur at heat treatment.

Then, in the present invention, a crystallized glass having a distortion point of not lower than 750° C. (typically 950 to 1100° C., preferably 1000 to 1050° C.) and having high heat resistance is used as a substrate. Since the crystallized glass can be made thinner than quartz, the cost of manufacture of a liquid crystal module or the like can be kept inexpensive. Moreover, because of the glass substrate, it is possible to make the substrate large, and it is also possible to design a reduction in costs by formation of plural products from one substrate according to multiple-face taking.

Further, the coefficient of thermal expansion can be easily changed by adjusting the constituents of the crystallized glass. Thus, it is easy to select the coefficient of thermal expansion near the coefficient of thermal expansion of the crystalline semiconductor thin film.

The present inventors aim at obtaining a system-on-panel, and realizing an inexpensive and high performance electronic equipment. For the purpose of actively using the merits, it is greatly more effective to use the inexpensive crystallized glass than the expensive quartz substrate.

However, since the crystallized glass has various constituents, there is a fear of outflow of constituents in the manufacturing steps of a semiconductor device. Thus, it is important to protect the crystallized glass with an insulating film (an insulating silicon film is preferable in view of affinity to a crystalline silicon film). For that purpose, in the entire process, it is necessary to protect at least the front surface and the back surface of the crystallized glass with the insulating film.

Since the side surface of the crystallized glass has a very small area on the whole, even if the side surface is exposed, a serious problem does not occur. However, it is needless to say that it is most preferable to completely cover the front surface, the side surface, and the back surface with the insulating film to completely prevent the outflow of the constituents.

However, a portion on which the insulating film is not formed occurs at a substrate supporting portion (pusher pin and the like) used in the film formation of the insulating film. However, since this portion is very small as compared with the total area, a problem does not occur.

In view of the above, the present inventors have reached the structure of the present invention that a crystalline semiconductor thin film excellent in conformity at crystal grain boundaries is provided on a high heat-resistant glass substrate in which the outer circumferential surface (preferably all surfaces) of the substrate is protected with an insulating silicon film.

DETAILED DESCRIPTION OF THE INVENTION

Figure 1A:
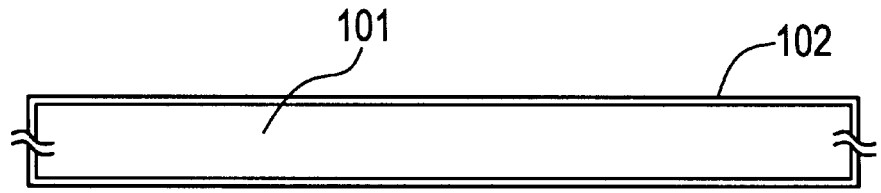
FIGS. 1A to 1D are views showing manufacturing steps of a semiconductor thin film.

Preferred embodiments of the present invention will now be described with reference to the drawings.

First, steps up to the formation of a high temperature polysilicon film will be described with reference to FIGS. 1A to 1D. As a substrate, a crystallized glass 101 with a thickness of 0.5 to 1.1 mm (typically 0.7 mm) is prepared. The crystallized glass is also called glass ceramics, and is defined as a glass substrate obtained by uniformly growing fine crystals at the stage of glass formation. Such crystallized glass has features that the heat resistance is high and the coefficient of thermal expansion is small.

The glass substrate used in the present invention is required to have a distortion point of not less than 750° C., preferably 950 to 1100° C., that is, the high heat resistance is required. In the present circumstances, although there is only crystallized glass as glass materials which realize such heat resistance, even if a glass substrate (for example, a high heat-resistant glass substrate in an amorphous state or the like) is not included in the definition of the crystallized glass, if the substrate has the foregoing heat resistance, the substrate can be used in the present invention.

The details of the crystallized glass may be referred to "Glass Handbook; Sumio Sakubana, et al., pp. 197 to 217, Asakura Shoten, 1975".

Although there are various kinds of crystallized glass, basically, it can be said that aluminosilicate glass mainly containing quartz ($SiO_2$) and alumina ($Al_2O_3$), borosilicate glass (containing $B_2O_3$), or the like is practical. However, in view of the use as a substrate for a semiconductor device, non-alkaline glass is preferable. In such a sense, it is preferable to use glass of MgO—$Al_2O_3$—$SiO_2$, PbO—ZnO—$B_2O_3$, $Al_2O_3$—$B_2O_3$—$SiO_2$, ZnO—$B_2O_3$—$SiO_2$, or the like.

The high insulation crystallized glass of MgO—$Al_2O_3$—$SiO_2$ includes $TiO_2$, $SnO_2$, $ZrO_2$ or the like as a nucleus formation agent, and is crystallized glass having cordierite (2 MgO2$Al_2O_3$5$SiO_2$) as a main crystal phase. This type of crystallized glass has features that the heat resistance is high and the electric insulation is superior even in the range of high frequency. An example of the constituents and the coefficient of thermal expansion of cordierite-based crystallized glass is shown in Table 1.

TABLE 1

| Constituent of glass (wt %) | | | | Coefficient of thermal expansion x |
|---|---|---|---|---|
| $SiO_2$ | $Al_2O_3$ | Mgo | $TiO_2$ | $10^{-6}$ (° C.)$^{-1}$ |
| 40–60 | 20–30 | 13–14 | 9–13 | 1.5–6.5 |

As the coefficient of thermal expansion becomes small, an influence of shrinkage due to heat becomes small. Thus, a substrate having a small coefficient of thermal expansion is preferable as a substrate for semiconductor in which minute pattern working is carried out. However, if the difference from the coefficient of thermal expansion of a semiconductor thin film is large, peeling or the like becomes apt to occur. Thus, it is preferable to use a substrate having a coefficient of thermal expansion near the coefficient of thermal expansion of a semiconductor thin film to the utmost degree. In view of these, it can be said that the cordierite-based crystallized glass containing $SiO_2$ of 45 to 57%, $Al_2O_3$ of 20 to 27%, MgO of 11 to 18%, and $TiO_2$ of 9 to 12% is preferable.

In the case where a transmission type LCD is manufactured, transparency is required for crystallized glass. In such a case, it is appropriate that non-alkaline transparent crystallized glass is used. For example, there is crystallized glass as shown in Table 2 as crystallized glass in which the crystal phase is filled β-quartz solid solution and the coefficient of thermal expansion is 1.1 to 3.0×$10^{-6}$° C.

TABLE 2

| Constituent of glass (wt %) | | | | | Coefficient of thermal expansion × $10^{-6}$ (° C.)$^{-1}$ |
|---|---|---|---|---|---|
| SiO$_2$ | Al$_2$O$_3$ | MgO | ZnO | ZrO$_2$ | |
| 64–75 | 16–25 | 3–10 | 0–7 | 3–10 | 1.1–3.0 |

The first structural conditions of the present invention is to use such crystallized glass as a substrate. Of course, if suitable contrivance (for example, completely protecting a substrate with an insulating film as in the present invention) is made, alkaline crystallized glass (Na$_2$O—Al$_2$O$_3$—SiO$_2$, Li$_2$O—Al$_2$O$_3$—SiO$_2$, or the like) may be used. Even if the coefficient of thermal expansion of the crystallized glass is very small (near zero), it is also possible to relax the difference in the coefficient of thermal expansion from a semiconductor thin film by coating the crystallized glass with glass having a coefficient of thermal expansion of 2.0 to 3.0×10$^{-6}$° C.

After the crystallized glass 101 having the above described structure is prepared, an amorphous silicon film 102 is formed on the crystallized glass 101. The film formation is carried out by a low pressure CVD method, and silane (SiH$_4$) or disilane (Si$_2$H$_6$) is used as a film formation gas. It is appropriate that the thickness is made 50 to 250 nm (typically 100 to 150 nm) (FIG. 1(A)).

When the film is formed by the low pressure CVD method in this way, it is possible to form the amorphous silicon film 102 on the front surface, the back surface, and the side surface so as to cover the crystallized glass 101. Strictly speaking, the amorphous silicon film 102 is not formed at a portion with which a pusher pin for supporting the substrate is brought into contact. However, the portion is very small as compared with the total area.

Next, a heat treatment is carried out to completely thermally oxidize the amorphous silicon film 102 to form a thermal oxidation film 103. In this case, since the amorphous silicon film 102 is completely thermally oxidized and is changed into the thermal oxidation film 103, the thickness of the thermal oxidation film 103 becomes 100 to 500 nm (typically 200 to 300 nm).

The condition of the heat treatment may be any means of well known dry O$_2$ oxidation, wet O$_2$ oxidation, steam oxidation, pyrogenic oxidation, oxygen partial pressure oxidation, and hydrochloric acid (HCl) oxidation. It is appropriate that suitable conditions are set for the process temperature and the process time in view of the process.

The heat treatment is carried out at a temperature not less than the distortion point of the crystallized glass and not higher than a gradual cooling point, and it is preferable to carry out such a process that after the temperature is kept, process temperature is gradually lowered. When such a process is carried out, countermeasures against shrinkage of glass can be taken at the same time as the formation of the thermal oxidation film. That is, when the substrate is sufficiently shrunken by the above process, it is possible to lower the amount of shrinkage of the substrate due to a subsequent heat treatment. The technique relating to this is disclosed in Japanese Patent Unexamined Publication No. Hei. 8-250744.

In the manner as described above, although the thermal oxidation film (silicon oxide film) 103 is formed, as described above, the amorphous silicon film 102 is formed so as to cover the crystallized glass 101, so that the thermal oxidation film 103 is also formed so as to cover the crystallized glass 101. That is, since the crystallized glass 101 is completely covered with the insulating silicon film, it becomes possible to prevent the outflow of constituents.

Here, although the silicon oxide film expressed by SixOy is used as the insulating silicon film, other insulating silicon films, such as a silicon nitride film expressed by SixNy or a silicon nitride oxide film expressed by SiOxNy, may be used.

In this way, two of the important conditions of the present invention, that is, using crystallized glass and covering the crystallized glass with an insulating silicon film can be achieved.

Figure 1B:
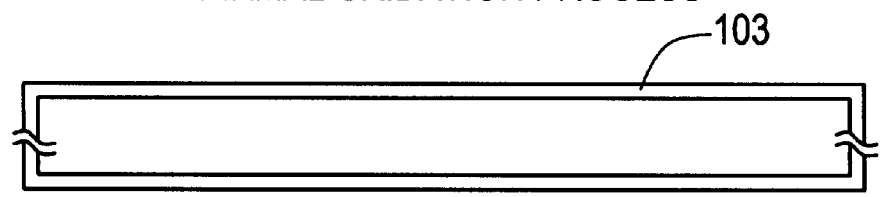
Figure 1C:
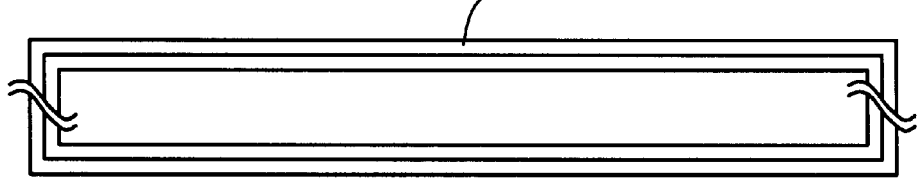

Next, a technique for forming a high temperature polysilicon film will be described. After the state shown in FIG. 1B is obtained, an amorphous silicon film 104 is formed by a low pressure CVD method, a plasma CVD method, or a sputtering method (FIG. 1C).

It is also possible to use a compound of silicon and germanium expressed by Si$_X$Ge$_{1-X}$ (0<X<1) instead of the amorphous silicon film 104. The thickness of the amorphous silicon film 104 is made 25 to 150 nm (preferably 50 to 100 nm).

Since there is a possibility that impurities, such as carbon, oxygen, and nitrogen, mixed during the film formation hinder subsequent crystallization, it is preferable to thoroughly lower them. Specifically, it is preferable to make management so that the concentration of each of carbon and nitrogen is less than 5×10$^{18}$ atoms/cm$^3$ (typically 5×10$^{17}$ atoms/cm$^3$ or less), and the concentration of oxygen is less than 1.5×10$^{19}$ atoms/cm$^3$ (typically 1×10$^{18}$ atoms/cm$^3$ or less). If the concentration of the impurities is made the foregoing value at the film formation, the concentration of the impurities in a completed TFT is also restricted within the foregoing range.

It is effective to add an impurity element (an element in group 13, typically boron, or an element in group 15, typically phosphorus) for controlling the threshold voltage (Vth) of the TFT at the film formation. The amount of addition must be determined in view of vth in the case where the foregoing Vth controlling impurity element is not added.

Figure 1D:
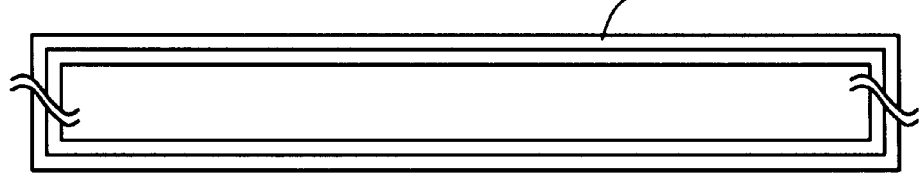

Next, a crystallizing step of the amorphous silicon film 104 is carried out. This step is carried out by furnace annealing after the amorphous silicon film 104 is cleaned. Specifically, a heat treatment at 600° C. for 24 hours is carried out in an electric heating furnace of an inert gas atmosphere (typically, nitrogen atmosphere) to make crystallization due to generation of natural nuclei. As the need arises, an oxygen annealing step or a nitrogen annealing step at a temperature of 700 to 900° C. may be added after the crystallization. In this way, the crystallization is made, so that a high temperature polysilicon film 105 is obtained (FIG. 1D).

The thus formed high temperature polysilicon film 105 is structured such that needle-like crystals are irregularly collected. The orientation is also irregular, and the orientation ratios of {111} plane and {110} plane are 0.6 or less, and the main orientation plane does not exist. This is also found from the fact that diffraction spots seen in the electron diffraction pattern are irregular. Incidentally, the orientation ratio is obtained from the definition disclosed in Japanese Patent Unexamined Publication No. Hei. 7-321339 by the present inventors et al.

Since the high temperature polysilicon film 105 is formed through the heat treatment at a temperature exceeding at least 800° C., the density of defects in crystal grains is very low. That is, the spin density measured by an ESR method is very small.

It is certain that the high temperature silicon film shows the spin density lower than at least other polysilicon films formed within a temperature range not larger than 800° C. (including a film using laser crystallization as well). Thus, the electric characteristics of a TFT using the high temperature polysilicon film are excellent.

Although an object of the present invention is to manufacture a semiconductor device using a high temperature polysilicon film at low cost, it is needless to say that the semiconductor thin film formed on the crystallized glass is not limited to only the high temperature polysilicon film.

The most important structure of the present invention is to protect at least the front surface and the back surface (preferably all surfaces) of crystallized glass with an insulating silicon film, and a semiconductor thin film formed thereon may be any semiconductor thin film as long as the process temperature is restricted within the temperature range not higher than the distortion point of the crystallized glass.

Next, steps to the point when a crystalline semiconductor thin film more excellent in the conformity of crystal grain boundary than the high temperature polysilicon film is formed, will be described with reference to FIGS. 2A to 2E. First, a crystallized glass 101 with a thickness of 0.5 to 1.1 mm (typically 0.7 mm) is prepared as a substrate. The crystallized glass to be used has been described in the explanation of formation of the high temperature polysilicon film.

Figure 2A:
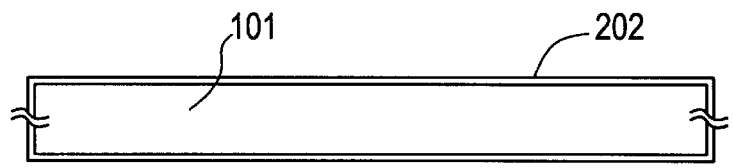
FIGS. 2A to 2E are views showing manufacturing steps of a semiconductor thin film.

After the crystallized glass 101 having the above described structure is prepared, an amorphous silicon film 202 is formed on the crystallized glass 101. The film formation is carried out by a low pressure CVD method, and silane ($SiH_4$) or disilane ($Si_2H_6$) is used as a film forming gas. It is appropriate that the thickness is made 50 to 250 nm (typically 100 to 150 nm) (FIG. 2A).

When the film is formed by the low pressure CVD method in this way, it is possible to form the amorphous silicon film 202 on the front surface, the back surface and the side surface so as to cover the crystallized glass 101. Strictly speaking, the amorphous silicon film 202 is not formed at a portion with which a pressure pin for supporting the substrate is brought into contact. However, the portion is very small as compared with the total area.

Next, a heat treatment is carried out to completely thermally oxidize the amorphous silicon film 202 so that a thermal oxidation film 203 is formed. In this case, since the amorphous silicon film 202 is completely thermally oxidized and is changed into the thermal oxidation film 203, the thickness of the thermal oxidation film 203 becomes 100 to 500 nm (typically 200 to 300 nm).

The condition of the heat treatment may be any means of well known dry $O_2$ oxidation, wet $O_2$ oxidation, steam oxidation, pyrogenic oxidation, oxygen partial pressure oxidation, and hydrochloric acid oxidation (HCl). It is appropriate that suitable conditions are set for the process temperature and the process time in view of the process.

The heat treatment is carried out at a temperature not less than the distortion point of the crystallized glass and not higher than a gradual cooling point, and it is preferable to carry out such a process that after the temperature is kept, process temperature is gradually lowered. When such a process is carried out, countermeasures against shrinkage of glass can be taken at the same time as the formation of the thermal oxidation film. That is, when the substrate is sufficiently shrunken by the above process, it is possible to lower the amount of shrinkage of the substrate due to a subsequent heat treatment. The technique relating to this is disclosed in Japanese Patent Unexamined Publication No. Hei. 8-250744.

In the manner as described above, although the thermal oxidation film (silicon oxide film) 203 is formed, the amorphous silicon film 202 is formed so as to cover the crystallized glass 101 as described above, so that the thermal oxidation film 203 is also formed so as to cover the crystallized glass 101. That is, since the crystallized glass 101 is completely covered with the insulating silicon film, it becomes possible to prevent the outflow of constituents.

Here, although the silicon oxide film expressed by SixOy is used as the insulating silicon film, other insulating silicon films, such as a silicon nitride film expressed by SixNy or a silicon nitride oxide film expressed by SiOxNy, may be used.

In this way, two of the important conditions of the present invention, that is, using crystallized glass and covering the crystallized glass with an insulating silicon film can be achieved.

Figure 2B:
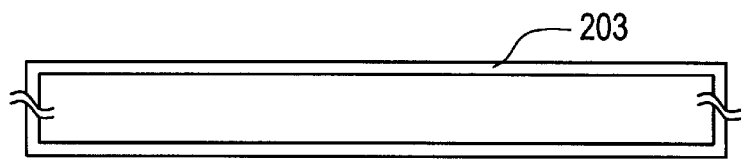

Next, a technique for forming a crystalline semiconductor thin film excellent in the conformity of crystal grain boundary will be described. After the state shown in FIG. 2B is obtained, an amorphous semiconductor thin film 204 is formed by a low pressure CVD method, a plasma CVD method, or a sputtering method.

However, in the case where the film is formed by the low pressure CVD method, it is preferable to remove the film formed on the back surface and the side surface before a subsequent crystallizing step is carried out. According to the experiences of the present inventors, it appears that the crystal state is degraded if the crystallizing step is carried out while the amorphous semiconductor thin film remains at the back surface and the side surface (the cause is not known).

As the amorphous semiconductor thin film 204, it is appropriate to typically use an amorphous silicon film. As other semiconductor thin films, it is also possible to use a compound of silicon and germanium expressed by $Si_xGe_{1-x}$ (0<X<1). The thickness of the amorphous silicon film 204 is made 25 to 100 nm (preferably 30 to 60 nm).

Since there is a possibility that impurities, such as carbon, oxygen, and nitrogen, mixed during the film formation hinder subsequent crystallization, it is preferable to thoroughly reduce them. Specifically, it is preferable to make management so that the concentration of each of carbon and nitrogen is less than $5 \times 10^{18}$ atoms/cm$^3$ (typically $5 \times 10^{17}$ atoms/cm$^3$ or less), and the concentration of oxygen is less than $1.5 \times 10^{19}$ atoms/cm$^3$ (typically $1 \times 10^{18}$ atoms/cm$^3$ or less). If the concentration of the impurities is made the foregoing value at the film formation, the concentration of the impurities in a completed TFT is also restricted within the foregoing range.

It is effective to add an impurity element (an element in group 13, typically boron, or an element in group 15, typically phosphorus) for controlling the threshold voltage (Vth) of a TFT at the film formation. The amount of addition must be determined in view of Vth in the case where the foregoing Vth controlling impurity element is not added.

Next, a crystallizing step of the amorphous semiconductor thin film 204 is carried out. As a means for crystallization, a technique disclosed in Japanese Patent Unexamined Publication No. Hei. 7-130652 by the present inventors et al. is used. Any means of Embodiment 1 and Embodiment 2 of the publication may be used, in the present invention, it is preferable to use the technical contents (described in Japanese Patent Unexamined Publication No. Hei. 8-78329 in detail) set forth in Embodiment 2.

Figure 2C:
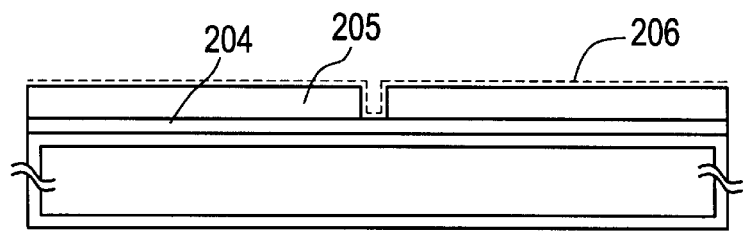

According to the technique disclosed in Japanese Patent Unexamined Publication No. Hei. 8-78329, a mask insulating film 205 for selecting an added region of a catalytic element is first formed. Then a solution containing a catalytic element for facilitating the crystallization of the amorphous semiconductor thin film 204 is applied by a spin coating method to form a catalytic element containing layer 206 (FIG. 2C).

As the catalytic element, one kind of or plural kinds of elements selected from nickel (Ni), cobalt (Co), iron (Fe), palladium (Pd), platinum (Pt), copper (Cu), gold (Au), Germanium (Ge), and lead (Pb) may be used. Especially, it is preferable to use nickel excellent in conformity of lattices to silicon.

The adding step of the foregoing catalytic element is not limited to the spin coating method, but an ion implantation method or a plasma doping method using a mask may also be used. In this case, since it becomes easy to decrease an occupied area of an added region and to control a growth distance of a lateral growth region, the method becomes an effective technique when a minute circuit is formed.

Figure 2D:
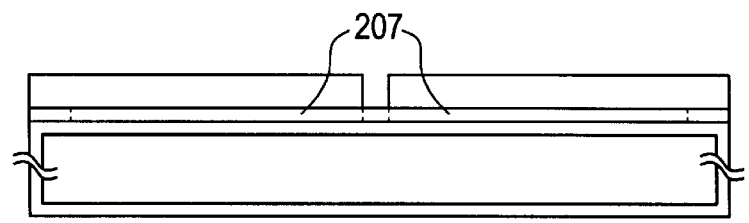

Next, after the adding step of the catalytic element is ended, dehydrogenating is carried out at about 500° C. for 2 hours, and then a heat treatment is carried out in an inert gas atmosphere, a hydrogen atmosphere, or an oxygen atmosphere at a temperature of 500 to 700° C. (typically 550 to 650° C., preferably 570° C.) for 4 to 24 hours to crystallize the amorphous semiconductor thin film 204 (FIG. 2D).

At this time, the crystallization of the amorphous semiconductor thin film 204 progresses first from nuclei generated in a region added with nickel, and a crystal region 207 grown almost parallel to the substrate surface of the crystallized glass 101 is formed. The present inventors refer to this crystal region 207 as a lateral growth region. Since respective crystals in the lateral growth region are gathered in a comparatively uniform state, the lateral growth region has such an advantage that the total crystallinity is superior (FIG. 2D).

After the heat treatment for crystallization is ended, the mask insulating film 205 is removed, and then, a heat treatment (gettering process for the catalytic element) for removing the catalytic element is carried out. In this heat treatment, a halogen element is made contained in a processing atmosphere and the gettering effect for a metallic element by the halogen element is used.

In order to sufficiently obtain the gettering effect by the halogen element, it is preferable to carry out the above heat treatment at a temperature exceeding 700° C. If the temperature is not higher than 700° C., it becomes difficult to decompose a halogen compound in the processing atmosphere, so that there is a fear that the gettering effect can not be obtained. Thus, the heat treatment is carried out preferably at a temperature of 800 to 1000° C. (typically 950° C.), and a processing time is made 0.1 to 6 hours, typically 0.5 to 1 hour.

As a typical example, it is appropriate that a heat treatment is carried out in an oxygen atmosphere containing hydrogen chlorine (HCl) of 0.5 to 10 vol% (preferably, 3 vol%) at 950° C. for 30 minutes. If the concentration of HCl is higher than the above-mentioned concentration, asperities comparable to a film thickness are produced on the surface of the lateral region 207. Thus, such a high concentration is not preferable.

As a compound containing a halogen element, one kind or plural kinds of compounds selected from compounds containing halogen elements, such as HF, $NF_3$, HBr, $Cl_2$, $ClF_3$, $BCl_3$, $F_2$, and $Br_2$, may be used other than the HCl gas.

In this step, the catalytic element in the lateral growth region 207 is gettered by the action of chlorine and is transformed into volatile chloride which is released into the air. After this gettering step, the concentration of the catalytic element in the lateral growth region 208 is lowered down to $5 \times 10^{17}$ atoms/cm$^3$ or less (typically $2 \times 10^{17}$ atoms/cm$^3$ or less).

The thus obtained lateral growth region 208 shows a unique crystal structure made of a collective of rod-like or flattened rod-like crystals. Its features will be described below.

Findings as to Crystal Structure of an Active Layer

An active layer of a TFT using the lateral growth region formed in accordance with the foregoing manufacturing steps has microscopically a crystal structure in which a plurality of rod-like (or flattened rod-like) crystals are arranged in almost parallel to each other and with regularity to a specific direction. This can be easily ascertained by observation with a TEM (Transmission Electron Microscope).

Figure 16A:
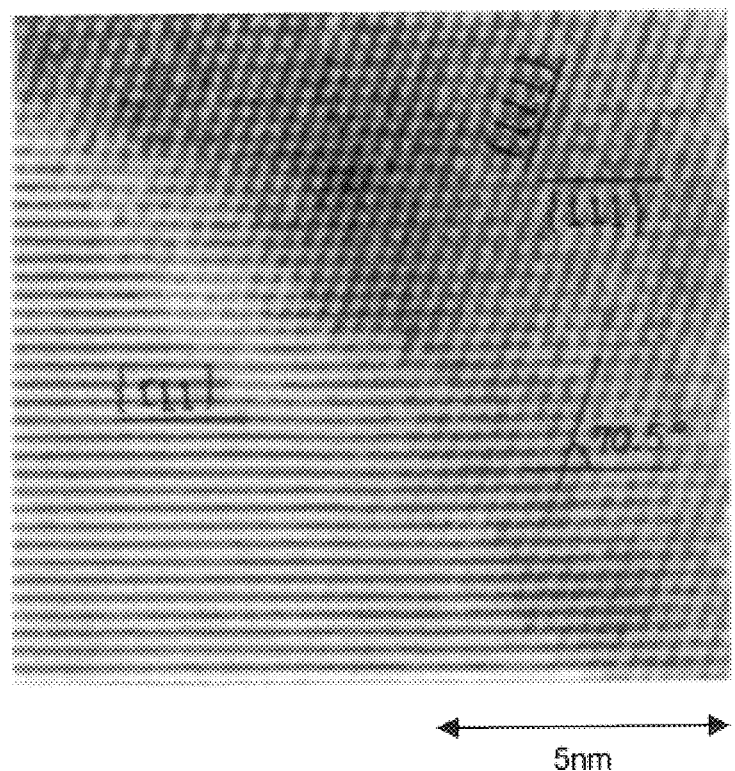
FIG. 16A is a TEM photographs showing lattice stripes of crystal grains of a CGS film.
Figure 16B:
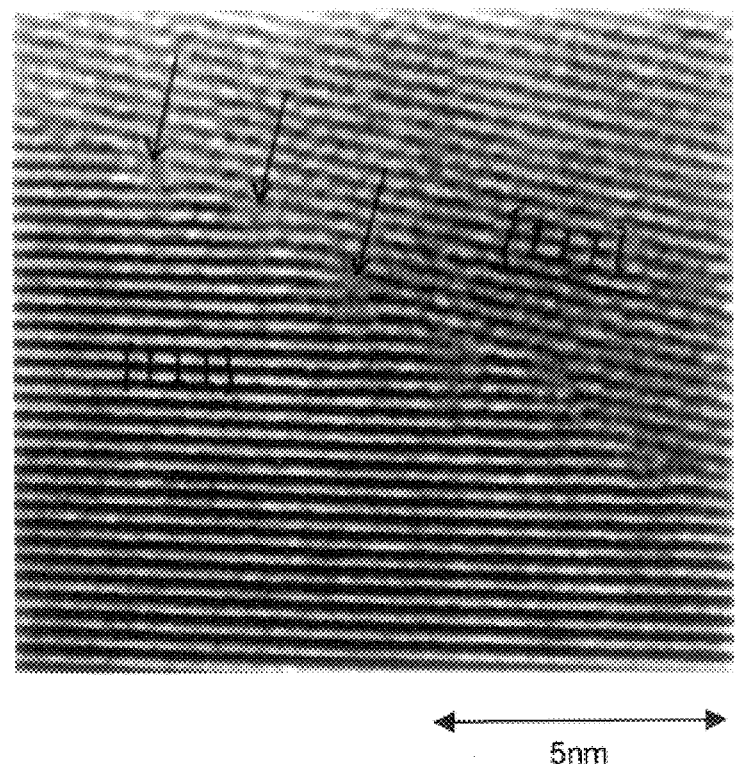
FIG. 16B is a TEM photographs showing lattice stripes of crystal grains of a high temperature polysilicon film.

FIGS. 16A and 16B are HR-TEM photographs showing crystal grain boundaries of rod-like or flattened rod-like crystals, magnified eight million times. In the present specification, the crystal grain boundary is defined as a grain boundary formed at an interface where rod-like or flattened rod-like crystals are in contact with each other. Thus, the crystal grain boundary is regarded as different from, for example, a macroscopic grain boundary formed by collision of lateral growth regions.

Incidentally, the foregoing HR-TEM (High Resolution Transmission Electron Microscope) is a method in which a sample is vertically irradiated with an electron beam, and the arrangement of atoms and molecules is estimated by using interference of transmitted electrons or elastically scattered electrons.

In the HR-TEM, it is possible to observe the state of arrangement of crystal lattices as lattice stripes. Thus, by observing the crystal grain boundary, it is possible to infer the bonding state of atoms in the crystal grain boundary. Incidentally, although lattice stripes appear as stripe patterns of black and white, they show the difference in contrast, and do not show the position of atoms.

FIG. 16A is a typical TEM photograph of a crystalline silicon film obtained by the present invention, and the state where two different crystal grains are in contact with each other at the crystal grain boundary seen from the upper left to the lower right in the photograph is observed. At this time, the two crystal grains were almost in {110} orientation although some deviations were included in crystal axes.

Although described later, as the result of investigation of a plurality of crystal grains, it is ascertained by X-ray diffraction and electron beam diffraction that almost all crystal grains are substantially in the {110} orientation. Although many observed crystal grains ought to include a (001) plane, (200) plane, and the like, those equivalent planes will be expressed together by a {110} plane.

As shown in FIG. 16A, lattice stripes corresponding to a {111} plane and {100} plane are observed in a face. Incidentally, the lattice stripe corresponding to the {111} plane indicates such a lattice stripe that when a crystal grain is cut along the lattice stripe, the {111} plane appears in the section. In a simplified manner, it is possible to ascertain by the distance between the lattice stripes to what plane the lattice stripe corresponds.

The reason why there is a difference in the appearance of the lattice stripes in FIG. 16A is that the slopes of the crystal grains are subtly different. That is, when it is designed so that the crystal face of one of crystal grains is vertically irradiated with an electron beam, the other crystal grain is slightly obliquely irradiated with the electron beam. Thus, the appearance of the lattice stripe is changed.

Here, attention is paid to the lattice stripe corresponding to the {111} plane. In FIG. 16A, the lattice stripe corresponding to the {111} plane of the crystal grain at the upper side above the grain boundary intersects the lattice stripe corresponding to the {111} plane of the crystal grain at the lower side at an angle of about 70° (precisely 70.5°).

Such crystal structure (precisely, the structure of crystal grain boundary) shows that two different crystal grains are in contact with each other with extremely excellent conformity. That is, the crystal lattices are continuous at the crystal grain boundary so that they make such a structure that it is very hard to produce trap levels due to crystal defects and the like. In other words, it can be said that the crystal lattices have continuity at the crystal grain boundary.

For reference, FIG. 16B shows an HR-TEM photograph of a conventional high temperature poolysilicon film. In the case of FIG. 16B, although described later, there was no regularity in the crystal plane, and the orientation was not such that the {110} plane became main. However, for comparison to FIG. 16A, observation was made here to such crystal grains that the lattice stripe corresponding to the {111} plane appeared.

When FIG. 16B is observed in detail, as shown by an arrow in the drawing, many portions where the lattice stripes are disconnected can be ascertained in the crystal grain boundary. In such portions, there are uncombined bonds (which can be called crystal defects), and there is a high possibility that as trap levels, they block the movement of carriers.

However, it is certain that the semiconductor thin film of the present invention also includes uncombined bonds as shown in FIG. 16B. This is inevitable as long as the semiconductor thin film of the present invention is polycrystal. However, as the result of TEM observation in detail for the semiconductor thin films of the present invention over a wide range, it has been found that such uncombined bonds are very few.

The present inventors refer to the bonding state of atoms in the case where the lattice strips correspond to each other with excellent conformity, like the semiconductor thin film used in the present invention, as conformity bond, and refer to chemical bonds at that time as conformity chemical bonds. On the contrary, the present inventors refer to the bonding state of atoms in the case where the lattice stripes do not correspond to each other with excellent conformity, which is often seen in a conventional high temperature polysilicon film, as unconformity bond, and refer to chemical bonds at that time as unconformity chemical bonds (or unpaired bonds or uncombined bonds).

Since the semiconductor thin film used in the present invention is very excellent in conformity at the crystal grain boundary, the foregoing unconformity chemical bonds are very few. According to the investigation by the present inventors, the existence ratio of the unconformity chemical bonds to the total chemical bonds is 10% or less (preferably 5% or less, more preferably 3% or less). That is, 90% or more of the whole chemical bonds (preferably 95% or more, more preferably 97% or more) are made of the conformity chemical bonds.

Also from this fact, it can be said that the crystalline silicon film of the present invention is a semiconductor film obviously different from a conventional high temperature polysilicon.

Figure 3A:
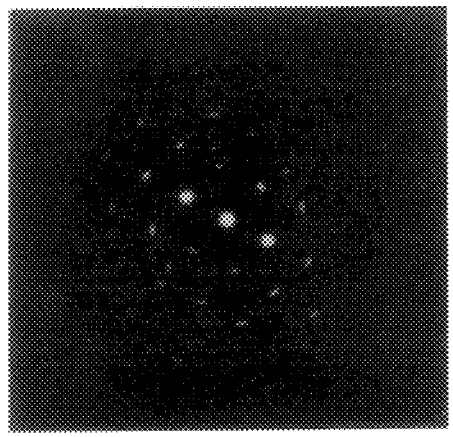
FIGS. 3A and 3B are views showing electron beam diffraction patterns.
Figure 3B:
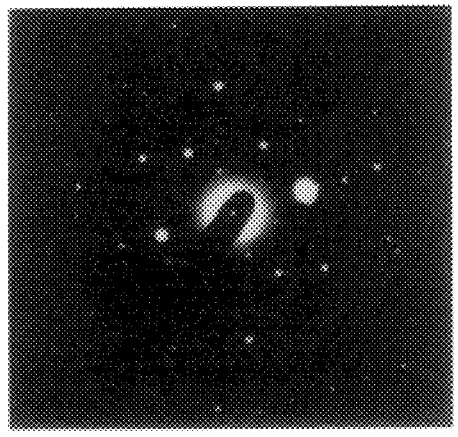

FIG. 3A shows the result of investigation of the semiconductor thin film of the present invention by an electron beam diffraction. For reference, FIG. 3B shows an electron beam diffraction pattern of a conventional high temperature polysilicon film. In FIGS. 3A and 3B, the diameters of irradiation areas of the electron beams are 4.35 μm and 1.35 μm, respectively. In this embodiment, typical photographs among measurements of plural positions are shown.

In the case of FIG. 3A, diffraction spots (diffraction fleck) corresponding to<110> incidence appear comparatively clearly, and it is ascertained that almost all crystal grains are in {111} orientation within the irradiation area of the electron beam.

The present inventors performed X-ray diffraction in accordance with a method disclosed in Japanese Patent Unexamined Publication No. Hei. 7-321339, and calculated the ratio of orientation with respect to the semiconductor thin film of the present invention. In the publication, the ratio of orientation is defined with the calculation method as indicated by the following expression 1:

{220} orientation existence ratio=1 (constant),

{111} orientation existence ratio=(relative strength of {111} to {220} of a sample)/(relative strength of {111} to {220} of powder), {311} orientation existence ratio=(relative strength of {311} to {220} of a sample)/(relative strength of {311} to {220} of powder), and {220} orientation ratio=({220} orientation existence ratio)/({220} orientation existence ratio+{111} orientation existence ratio+{311} orientation existence ratio).

Figure 17:
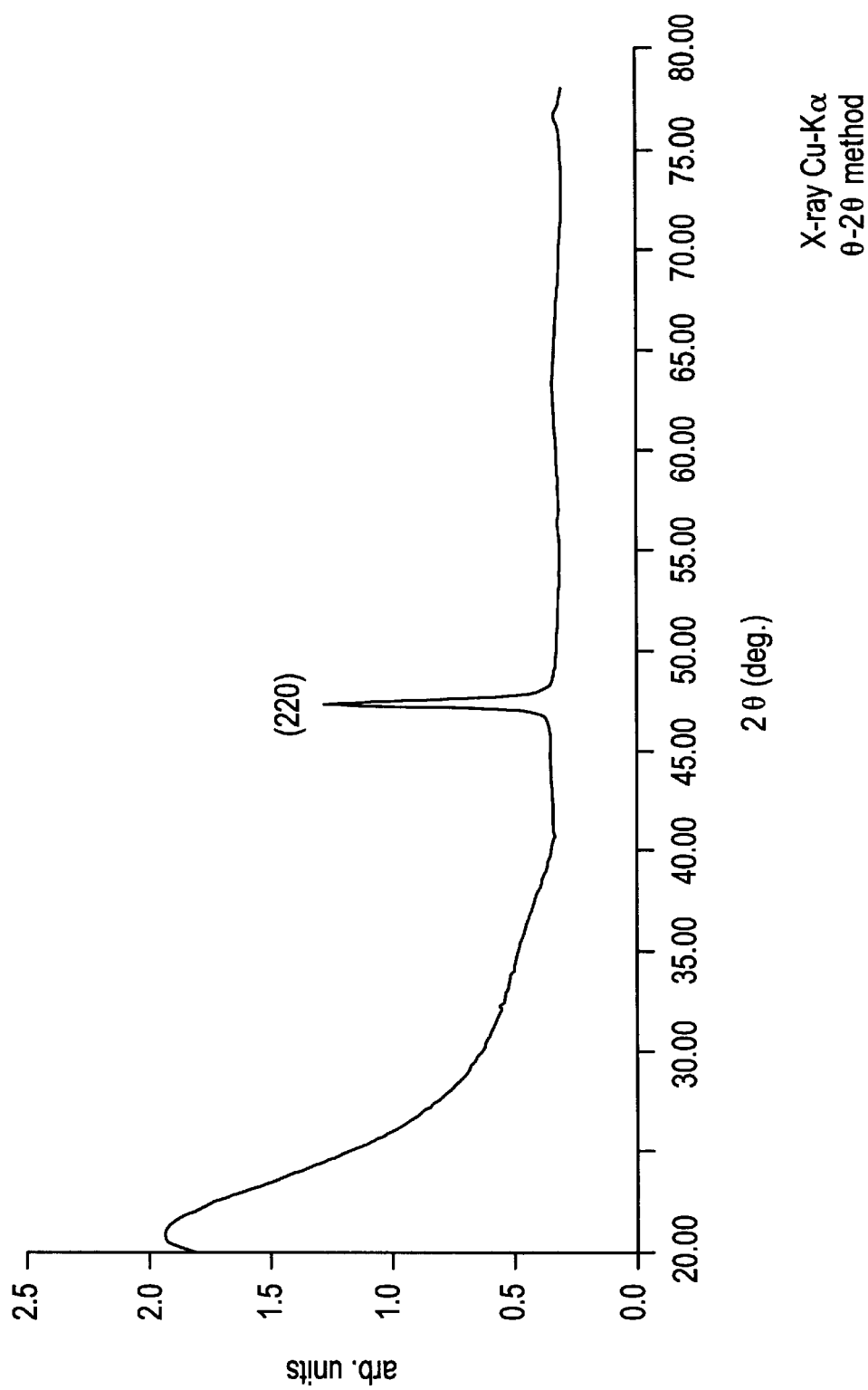
FIG. 17 is a view showing the result of X-ray diffraction of a CGS film.

As the result of investigation of the orientation of the semiconductor thin film of the present invention by the X-ray diffraction, a peak corresponding to a (220) plane appears in the X-ray diffraction pattern. The result is shown in FIG. 17. Of course, it is needless to say that the (220) plane is equivalent to the {110} plane. As the result of this measurement, it was found that the {110} plane is the main oriented plane, and the ratio of orientation is 0.7 or more (typically 0.9 or more).

On the other hand, in the case of the conventional high temperature polysilicon film shown in FIG. 3B, it was found that definite regularity could not be seen in the diffraction spots, and they were oriented almost at random, in other words, crystal grains with plane orientation other than the {110} plane were irregularly mixed.

Although the respective diffraction spots have small concentric expanses, it is presumed that this is caused from a distribution of rotation angles of some degree around a crystal axis. That is, although a completely circular diffraction spot ought to be obtained for single, crystal, since the semiconductor thin film used in the present invention is polycrystal, the fluctuation of the diffraction spot arises.

However, that the diffraction spot is nearly a circle means that rotation angles existing among a plurality of crystal grains are very small. Thus, the semiconductor thin film of the present invention in which the diffraction spot is almost a circle is substantially none other than single crystal.

As described above, the semiconductor thin film manufactured through the manufacturing steps shown in FIGS. 2A to 2E is a semiconductor thin film having a crystal structure (precisely, a structure of crystal grain boundary) quite different from a conventional semiconductor thin film. The present applicant refers to the semiconductor thin film having such a crystal structure as continuous grain boundary crystal silicon (Continuous Grain Silicon: CGS). Thus, the active layer of the TFT used in the present invention is formed of the CGS film having such a unique crystal structure.

Incidentally, in the formation of the CGS film, the annealing step (here, the step shown in FIG. 2E) at a temperature above a crystallizing temperature required for crystallization plays an important role with respect to lowering of defects in a crystal grain. This will be described.

Figure 18A:
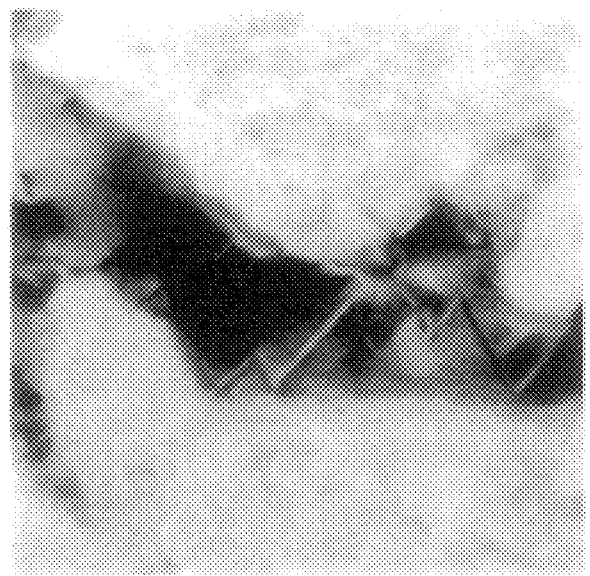
FIGS. 18A and 18B are TEM photographs showing the state of defects in grains of a CGS film, respectively.

FIG. 18A is a TEM photograph of a crystalline silicon film at the point of time when steps up to the crystallizing step shown in FIG. 2C have been ended, which is magnified 250 thousands times. Zigzag defects as indicated by arrows are ascertained in the crystal grain (black portion and white portion appear due to difference of contrast).

Although such defects are mainly a lamination defect in which the order of lamination of atoms on a silicon crystal lattice plane is discrepant, there is also a case of dislocation or the like. It appears that FIG. 18A shows the lamination defect having a defect plane parallel to the {111} plane. This can be inferred from the fact that the zigzag defects are bent at about 70°.

Figure 18B:
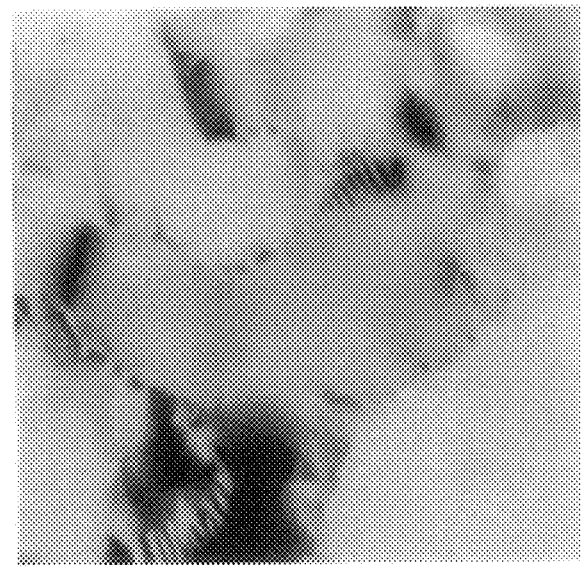

On the other hand, as shown in FIG. 18B, in the crystalline silicon film of the present invention, which is magnified at the same magnification, it is ascertained that there are hardly seen defects caused by the lamination defect, dislocation, or the like, and the crystallinity is very high. This tendency can be seen in the entire of the film surface, and although it is difficult to reduce the number of defects to zero in the present circumstances, it is possible to reduce the number to substantially zero.

That is, in the crystalline silicon film shown in FIG. 18B, defects in the crystal grain are reduced to the degree that the defects can be almost neglected, and the crystal grain boundary can not become a barrier against the movement of carriers because of the high continuity, so that the film can be regarded as single crystal or substantially single crystal.

As described above, in the crystal silicon films shown in the photographs of FIGS. 18A and 18B, although the crystal grain boundaries have almost equal continuity, there is a large difference in the number of defects in the crystal grains. The reason why the crystal silicon film according to the present invention shows electrical characteristics much higher than the crystal silicon film shown in FIG. 18A is mainly the difference in the number of defects.

Figure 2E:
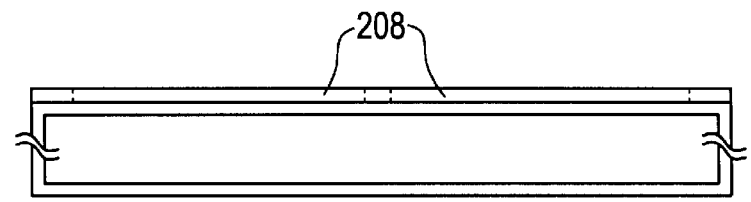

The present inventors consider the following model for a phenomenon occurring in the step shown in FIG. 2E. First, in the state shown in FIG. 18A, the catalytic element (typically nickel) is segregated at the, defects (mainly the lamination defects) in the crystal grain. That is, it is conceivable that there are many bonds having a form such as Si—Ni—Si.

However, when Ni existing in the defects is removed by carrying out the gettering process of the catalytic element, the bond of Si—Ni is cut. Thus, the remaining bond of silicon immediately forms Si Si bond and becomes stable. In this way, the defects disappear.

Of course, although it is known that the defects in a crystal silicon film disappear by thermal annealing at a high temperature, it is presumed that in the present invention, since bonds with nickel are cut and many uncombined bonds are generated, the recombination of silicon is further smoothly carried out.

Moreover, at the same time, it is conceivable that surplus silicon atoms generated at the thermal oxidation of the crystalline silicon film move to the defects and greatly contribute to the generation of Si—Si bond. This concept is known as the reason why defects are few in the so-called high temperature polysilicon film.

Besides, the present inventors consider a model in which the crystalline silicon film is bonded to its under film by a heat treatment at a temperature (typically, 700 to 1100° C.) above the crystallizing temperature and adhesiveness is increased, so that the defects disappear.

There is a difference of nearly 10 times in thermal expansion coefficient between the crystal silicon film and the silicon oxide film as the under film. Thus, in the state (FIG. 18A) in which the amorphous silicon film is transformed into the crystal silicon film, a very large stress is applied to the crystal silicon film when the crystal silicon film is cooled.

Figure 19A:
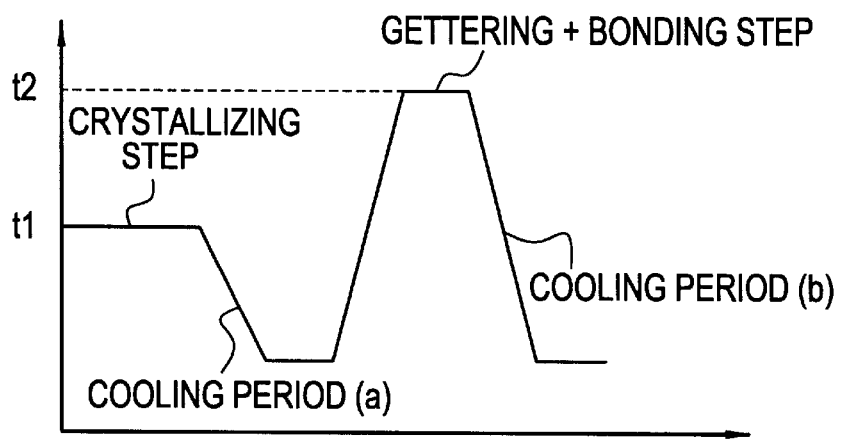
FIGS. 19A to 19C are views for explaining a model relating to generation and disappearance of defects.

This will be described, with reference to FIGS. 19A to 19C. FIG. 19A shows heat hysteresis applied to the crystal silicon film after the crystallizing step. First, the crystal silicon film crystallized at a temperature ($t_1$) is cooled to room temperature through a cooling period (a).

Figure 19B:
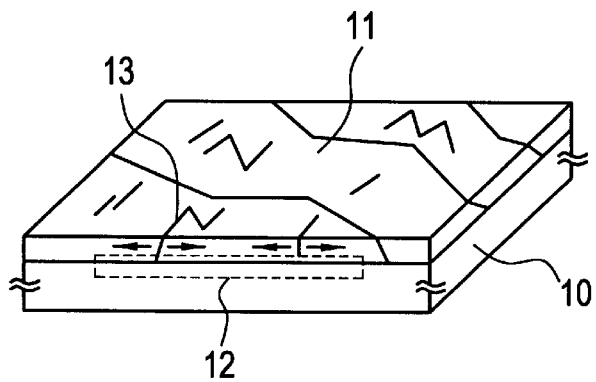
Figure 19C:
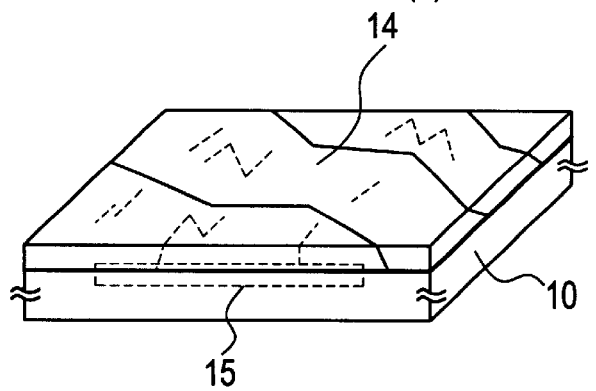

FIG. 19B shows the crystal silicon film during the cooling period (a), in which reference numeral 10 denotes a quartz substrate, and 11 denotes a crystal silicon film. At this time, adhesiveness at an interface 12 between the crystal silicon film 11 and the substrate 10 is not very high, and it is conceivable that this causes production of many defects in grains.

That is, it is conceivable that the crystal silicon film 11 pulled due to the difference in the coefficient of thermal expansion is very easily moved on the quartz substrate 10, so that defects 13 such as lamination defects or dislocations are easily produced by force such as tensile stress.

The thus obtained crystal silicon film becomes the state as shown in FIG. 18A. Thereafter, as shown in FIG. 19A, the gettering step of the catalytic element is carried out at a temperature ($t_2$), and as the result, the defects in the crystal silicon film disappear because of the above-described reason.

The important point here is that the crystal silicon film is bonded to the quartz substrate at the same time as the gettering step of the catalytic element, so that the adhesiveness to the quartz substrate is raised. That is, it is conceivable that this gettering step also serves as a bonding step of the crystal silicon film to the quartz substrate (under film).

After the gettering+bonding step is ended in this way, the film is cooled to room temperature through a cooling period (b). Here, the different point from the cooling period (a) after the crystallizing step is that an interface 15 between the quartz substrate 10 and a crystal silicon film 14 after annealing is in a state having very high adhesiveness (FIG. 19C).

When the adhesiveness is high like this, since the crystal silicon film 14 is completely bonded to the quartz substrate 10, even if stress is applied to the crystal silicon film at the cooling stage of the crystal silicon film, defects are not produced. That is, it is possible to prevent defects from being produced again.

Incidentally, in FIG. 19A, although there is exemplified a process in which the temperature is lowered to room temperature after the crystallizing step, it is also possible to carry out the gettering+bonding step by directly raising the temperature after the end of crystallization. Even if such a process is carried out, the crystal silicon film of the present invention can be obtained.

The thus obtained crystal silicon film (FIG. 18B) of the present invention has a feature that the number of defects in crystal grains is greatly smaller than the crystal silicon film (FIG. 18A) in which merely crystallization is carried out.

The difference in the number of defects appears as the difference in spin density by an electron spin resonance analysis (Electron Spin Resonance: ESR). In the present circumstances, it is ascertained that the spin density of the crystal silicon film of the present invention is at most $5\times10^{17}$ spins/cm$^3$ (preferably $3\times10^{17}$ spins/cm$^3$ or less). However, since this measurement value is near the detection limit of an existing measuring device, it is expected that the actual spin density is lower than this value.

Findings as to Electrical Characteristics of a TFT

A TFT including an active layer of the foregoing CGS shows electrical characteristics comparable to a MOSFET using single crystal silicon. Data as set forth below are obtained from TFTs experimentally formed by the present inventors.

(1) The subthreshold coefficient as an index showing switching performance (promptness in switching of on/off operation) of a TFT is as small as 60 to 100 mV/decade (typically 60 to 85 mV/decade) for both an N-channel TFT and a P-channel TFT.

(2) The field effect mobility ($\mu_{FE}$) as an index showing an operation speed of a TFT is as large as 200 to 650 cm$^2$/Vs (typically 250 to 300 cm$^2$/Vs) for an N-channel TFT, and 100 to 300 cm$^2$/Vs (typically 150 to 200 cm$^2$/VS) for a P-channel TFT.

(3) The threshold voltage ($V_{th}$) as an index indicating a driving voltage of a TFT is as small as −0.5 to 1.5 V for an N-channel TFT and −1.5 to 0.5 V for a P-channel TFT.

As described above, it is ascertained that extremely superior switching characteristics and high speed operation characteristics can be realized.

Findings as to Circuit Characteristics

Next, frequency characteristics by a ring oscillator employing TFTs manufactured by using the CGS film will be described. The ring oscillator is a circuit in which an odd number of inverter circuits each made of a CMOS structure are connected like a ring, and is used for obtaining a delay time per inverter circuit. The structure of the ring oscillator used in experiments are as follows:

the number of stages: nine the thickness of a gate insulating film of a TFT:30 nm and 50 nm the gate length of a TFT:0.6 μm.

As the result of investigation of the oscillation frequency, it was possible to obtain the oscillation frequency of 1.04 GHz at the maximum value. Moreover, a shift register as one of TEGs of LSI circuits was actually manufactured and the operation frequency was ascertained. As a result, the output pulse of operation frequency 100 MHz was obtained in the shift resister in which the thickness of the gate insulating film is 30 nm, the gate length is 0.6 μm, the power source voltage is 5 V, and the number of stages is 50.

The above described surprising data of the ring oscillator and the shift register show that the TFT of the present invention has performance comparable to or exceeding an IGFET using single crystal silicon.

Findings as to Relation Between TFT Characteristics and CGS

The superior TFT characteristics and circuit characteristics as described above mainly depend on the fact that the CGS film having continuity of crystal lattices at the crystal grain boundary is used as the active layer of the TFT. The reason will be considered below.

The continuity of the crystal lattices at the crystal grain boundary is caused from the fact that the crystal grain boundary is a grain boundary called "planar grain boundary". The definition of the planar grain boundary is given as "Planar boundary" set forth in "Characterization of High-Efficiency Cast-Si Solar Cell Wafers by MBIC Measurement; Ryuichi Shimokawa and Yutaka Hayashi, Japanese Journal of Applied Physics vol. 27, No. 5, pp. 751–758, 1988".

According to the above paper, the planar boundary includes {111} twin grain boundary, {111} lamination defect, {221} twin grain boundary, {221} twist grain boundary, and the like. The planar boundary has a feature that it is electrically inactive. That is, although the planar boundary is a crystal grain boundary, it does not function as a trap for blocking the movement of carriers, so that it can be regarded as substantially not existing.

Particularly, the {111} twin grain boundary is also called a corresponding grain boundary of Σ3, and the {221} twin grain boundary is also called a corresponding grain boundary of Σ9. The Σ value is a parameter which becomes an index showing the degree of conformity of a corresponding grain boundary. It is known that as the Σ value is small, the conformity of the crystal grain boundary is superior.

As the result of observation of the semiconductor thin film of the present invention in detail with the TEM performed by the present applicant, it was found that almost all crystal grains (90% or more, typically 95% or more) was the corresponding grain boundary of Σ3, that is, the {111} twin grain boundary.

In the crystal grain boundary formed between two crystal grains, when the plane orientations of both the crystals are {110}, and if an angle formed by lattice stripes corresponding to the {111} plane is θ, it is known that when θ is 70.5°, the boundary becomes the corresponding grain boundary of Σ3.

Thus, in the crystal grain boundary shown in the TEM photograph of FIG. 16A, the respective lattice stripes of adjacent crystal grains are continuous at an angle of about 70°, so that it is easily inferred that this crystal grain boundary is the {111} twin crystal grain boundary.

Incidentally, when θ is 38.9°, the boundary becomes the corresponding grain boundary of Σ9. Such other crystal grain boundary also existed.

Such a corresponding grain boundary is formed only between crystal grains of the same plane orientation. That is, since the plane orientation of the semiconductor thin film of the present invention is uniform roughly as {110}, such a corresponding grain boundary can be formed over a wide range. This feature can not be obtained by other polysilicon films in which the plane orientation is irregular.

Figure 20A:
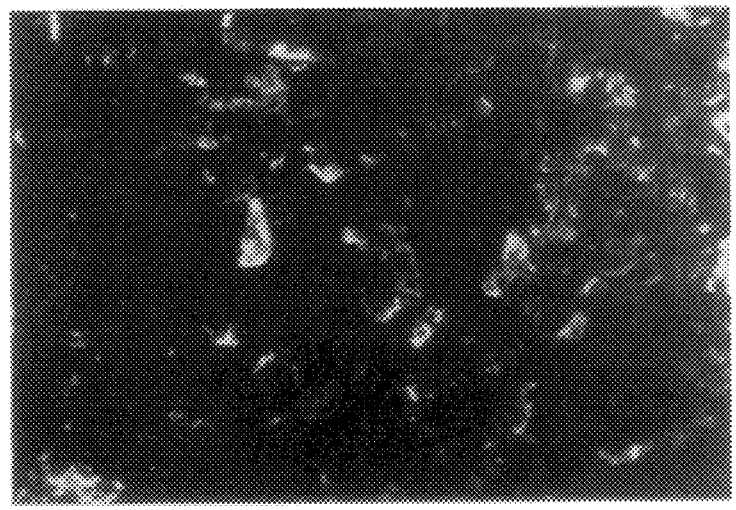
FIGS. 20A and 20B are TEM photographs showing a dark field image of a CGS film, respectively.

FIG. 20A is a TEM photograph (dark field image) of a semiconductor thin film of the present invention, which is magnified 15 thousands times. Although white regions and black regions are seen in the photograph, portions of the same color have the same orientation.

The remarkable feature in FIG. 20A is that in the dark field image of such a wide range, the white regions are continuously united at a rather high rate. This means that crystal grains having the same orientation exist with some directionality, and adjacent crystal grains have almost the same orientation.

Figure 20B:

On the other hand, FIG. 20B is a TEM photograph (dark field image) in which a conventional high temperature polysilicon film is magnified 15 thousands times. In the conventional high temperature polysilicon film, portions of the same plane orientation merely exist at random, and the uniformity with directionality as shown in FIG. 20A can not be ascertained. It is conceivable that this is caused from irregularity of orientation of adjacent crystal grains.

By repeating observations and measurements over a number of regions other than the measured points shown in FIG. 16A, the present applicant ascertains that the continuity of the crystal lattices at the crystal grain boundary is maintained in a sufficiently wide region for manufacturing a TFT.

The present invention having the above described structure will be described in more detail with specific embodiments shown below.

Embodiment 1

In this embodiment, manufacturing steps of a semiconductor device having the structure of the present invention will be described with reference to FIGS. 4A to 4D. Specifically, there is shown an example in which a driving circuit constituted by CMOS circuits in which an NTFT (N-channel TFT) and a PTFT (P-channel TFT) using a polysilicon film are complementarily combined, and a pixel matrix circuit constituted by NTFTs are integrally formed on the same substrate.

First, in accordance with the manufacturing steps explained by using FIGS. 1A to 1D, a crystalline silicon film (typically, polycrystal silicon film) 105 is formed. Then the polycrystal silicon film 105 is patterned to form active layers 403 to 405. At this time, although the polycrystal silicon film formed on the side surface of a crystallized glass 401 is removed, the polycrystal silicon film on the back surface remains as it is.

Reference numeral 403 denotes the active layer of the PTFT of the CMOS circuit, 404 denotes the active layer of the NTFT of the CMOS circuit, and 405denotes the active layer of the pixel matrix circuit, and the thickness of each layer is 50 nm.

The crystallized glass 401 used in this embodiment has the composition of $SiO_2$: 65%, $Al_2O_3$: 25%, MgO: 10%, and $ZrO_2$: 10%. This crystallized glass 401 has a feature that it is transparent. Reference numeral 402 denotes a silicon oxide film obtained by thermal oxidation of an amorphous silicon film, and the thickness thereof is 400 nm.

Figure 4A:
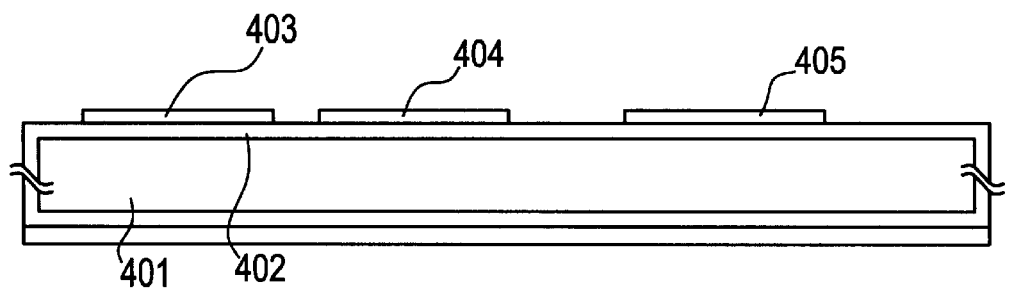
FIGS. 4A to 4D are view showing manufacturing steps of a thin film transistor.

In this way, the state of FIG. 4A is obtained. Next, a thermal oxidation step is carried out at a temperature of 1000° C. to form gate insulating films 406 to 408 made of thermal oxidation films with a thickness of 50 nm. The processing atmosphere may be a dry $O_2$ atmosphere or a wet $O_2$ atmosphere. It does not matter if a silicon nitride oxide film, a silicon nitride film, or the like is formed on the thermal oxidation film so that the gate insulating film is made of a lamination structure.

It is also possible to form a silicon nitride oxide film by a low pressure CVD method using silane ($SiH_4$) and nitrous oxide ($N_2O$) as a film forming gas and to utilize the film as the gate insulting film. It is appropriate that the temperature of film formation is made 800 to 900° C.

Further, it is also effective to form a silicon oxide film, a silicon nitride film, or a silicon nitride oxide film by a plasma CVD method, a sputtering method, or a low pressure CVD method, and thereafter, a thermal oxidation step is carried out. In this case, a thermal oxidation reaction progresses at an interface between the active layers and the foregoing insulating film. This structure is effective for preventing breakdown of the gate insulating film by an edge thinning phenomenon (phenomenon in which a thermal oxidation film becomes extremely thin at an end of an active layer).

After the gate insulating films 406 to 408 are formed in this way, a polycrystal silicon film having N-type conductivity is formed, and patterning is carried out by using resist masks 409 to 411 as masks to form gate electrodes 412 to 414. At this time, over etching is carried out after the pattern formation to etch the side surfaces of the gate electrodes by 500 nm to 1.5 μm (typically 800 nm to 1 μm).

Figure 4B:
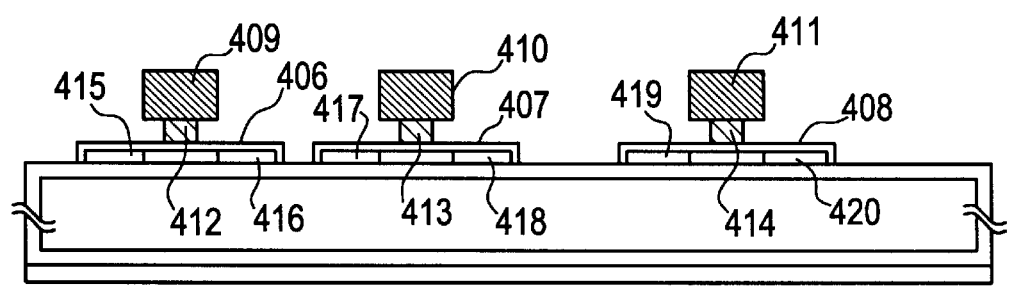

As shown in FIG. 4B, an adding step of phosphorus (or arsenic is also available) is carried out in such a state that the resist mask 409 to 411 become like umbrellas. This adding step is carried out by an ion implantation method or a plasma doping method. In this way, phosphorus added regions 415 to 420 containing phosphorus with a concentration of $1 \times 10^{20}$ to $1 \times 10^{21}$ atoms/cm$^3$ are formed.

Next, a resist mask 421 is formed to overlap with the resist masks 409 to 411 so that only a region which becomes the PTFT is exposed. Since the resist masks 409 to 411 are hardened by the adding step of phosphorus, they are not removed at the development of the resist mask 421.

Figure 4C:
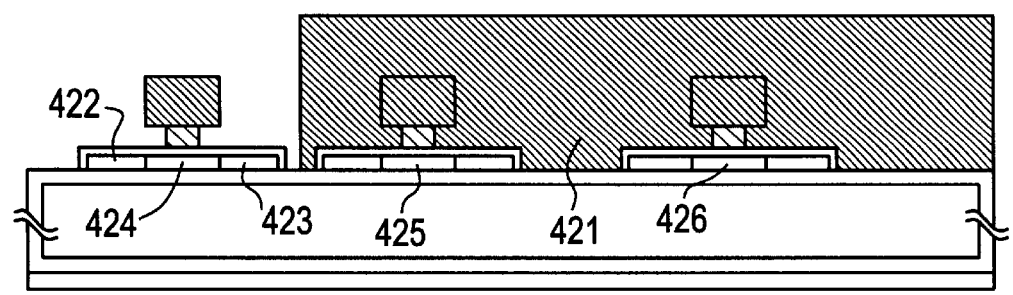
Figure 4D:
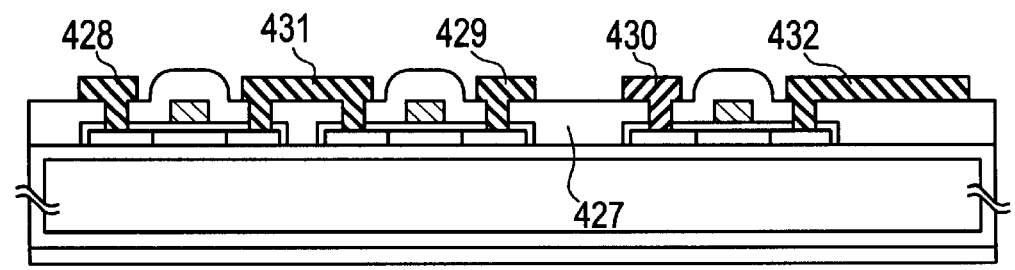

After the state of FIG. 4C is obtained in this way, an adding step of boron is carried out in the same manner as that of phosphorus. Since it is necessary to invert the phosphorus added regions 415 and 416 into a P type by this step, it is preferable to add boron with a concentration at least three times as the concentration of phosphorus. In this way, boron added regions 422 and 423 are formed.

After all the foregoing doping steps are ended, furnace annealing is carried out at a temperature of 600 to 900° C. for 0.5 to 8 hours, so that the added impurities are activated. This step may be carried out by laser annealing or lamp annealing, which may be combined with the furnace annealing.

Regions 417 and 418 formed by the above steps become a drain region and a source region of the NTFT constituting the CMOS circuit, respectively. Regions 419 and 420 become a source region and a drain region of the NTFT constituting the pixel matrix circuit, respectively. Regions 422 and 423 become a source region and a drain region of the PTFT constituting the CMOS circuit, respectively.

Regions (undoped regions) 424 to 426 in which the impurities were not added become intrinsic or substantially intrinsic regions. The phrase "substantially intrinsic" means that the concentration of an impurity giving an N type or a P type is not larger than the spin density, or the concentration of the impurity is within the range of $1 \times 10^{14}$ to $1 \times 10^{17}$ atoms/cm$^3$.

In these undoped regions 424 to 426, a portion to which a gate voltage is applied functions as a channel formation region, and a portion to which the gate voltage is not applied functions as an offset region.

Next, a first interlayer insulating film 427 made of a lamination film of a silicon nitride film with a thickness of 25 nm and a silicon oxide film with a thickness of 900 nm is formed. Then source electrodes 428 to 430, and drain electrodes 431 and 432 made of lamination films of Ti/Al/Ti (in this order, the thickness is 100/500/100 nm) are formed.

Next, a second interlayer insulating film made of a lamination structure of a silicon nitride film 433 with a thickness of 50 nm, a silicon oxide film (not shown) with a thickness of 20 nm, and a polyimide film 434 with a thickness of 1 μm is formed. Instead of polyimide, other organic resin film of acryl, polyamide, or the like may be used. The silicon oxide film with a thickness of 20 nm in this case functions as an etching stopper when the polyimide film 434 is dry-etched.

Figure 5A:
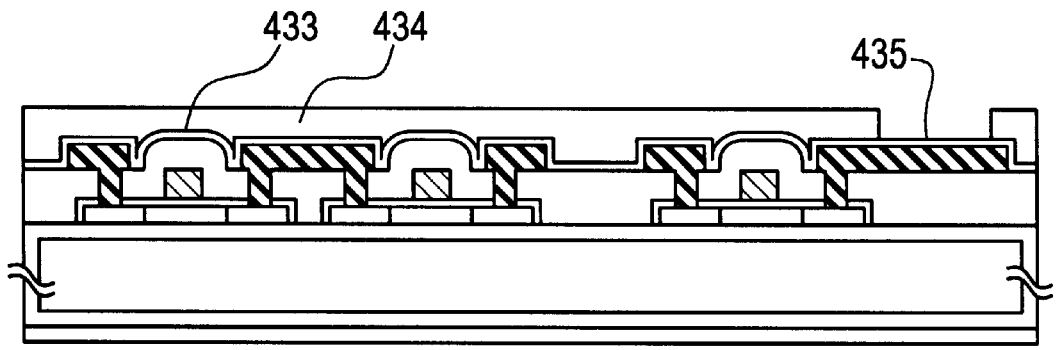
FIGS. 5A to 5C are views showing manufacturing steps of a thin film transistor.

After the second interlayer insulating film is formed, the polyimide film 434 is etched at a region where auxiliary capacitance is subsequently formed, so that an opening portion 435 is provided. At this time, only the silicon nitride film 433 is made to remain on the bottom of the opening portion 435 or both the silicon nitride film 433 and the silicon oxide film (not shown) are made to remain (FIG. 5A).

Figure 5B:
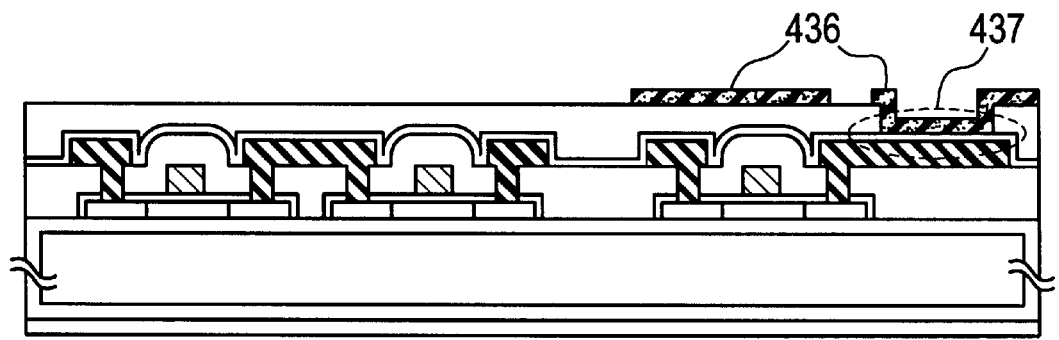

Then a titanium film with a thickness of 300 nm is formed, and patterning is carried out to form a black mask 436. This black mask 436 is disposed over the pixel matrix circuit and a portion which requires shading, such as a TFT and wiring portion (FIG. 5B).

At this time, at the foregoing opening portion 435, the drain electrode 432 of the pixel matrix circuit is positioned near the black mask 436 through the intervening silicon nitride film 433 (or the lamination film of the silicon nitride film and the silicon oxide film). In this embodiment, the black mask 436 is kept at a fixed potential, and an auxiliary capacitance 437 including the drain electrode 432 as a lower electrode and the black mask 436 as an upper electrode is formed. In this case, since the dielectric is very thin and its relative dielectric constant is high, large capacitance can be secured.

After the black mask 436 and the auxiliary capacitance 437 are formed in this way, a polyimide film with a thickness of 1 $\mu$m is formed to form a third interlayer insulating film 438. Then the third interlayer insulating film 438 is etched to form a contact hole (not shown).

At this time, at the point of time when the resist mask for the formation of the contact hole is formed, the polycrystal silicon film remaining on the back surface of the substrate is removed by a dry etching method. Since the substrate is protected by the resist mask, even if the substrate is set in a chamber while the front surface side of the substrate is made down, the component forming surface is not damaged.

Figure 5C:
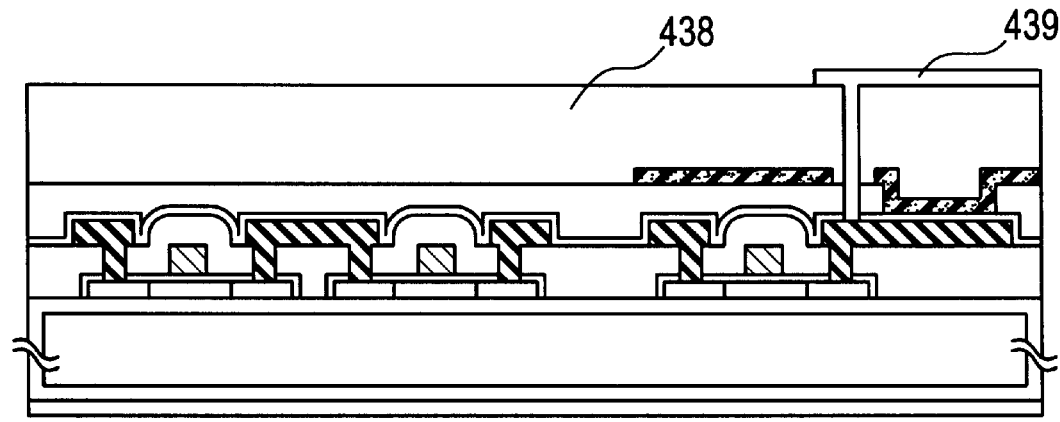

Next, a pixel electrode 439 made of a transparent conductive film (typically ITO) and having a thickness of 120 nm is formed on the third interlayer insulating film 438 (FIG. 5c).

Finally, a heat treatment in a hydrogen atmosphere is carried out at 350° C. for about two hours to hydrogenate the entire of the component. In this way, an active matrix substrate as shown in FIG. 5C is completed. Subsequently, a liquid crystal layer is held between the active matrix substrate and an opposite substrate by a well-known cell assembling step, so that an active matrix type liquid crystal display device (transmission type) is completed.

The structure of the active matrix substrate is not limited to this embodiment, but any structure may be adopted. That is, as long as the structure satisfies the structural conditions of the present invention, a user can freely design a TFT structure, a circuit arrangement, and the like.

For example, although the transparent conductive film is used as the pixel electrode in this embodiment, if this film is changed to a material having high reflectivity, such as aluminum alloy film, a reflection type active matrix liquid crystal display device can be easily realized. In this case, it is not necessary that the crystallized glass as the base of the active matrix substrate is transparent, but a shading substrate may be used.

Embodiment 2

In this embodiment, manufacturing steps of a semiconductor device having the structure of the present invention will be described with reference to FIGS. 6A to 6D. Specifically, there is shown an example in which a driving circuit and a logic circuit constituted by CMOS circuits in which an NTFT (N-channel TFT) and a PTFT (P-channel TFT) using CGS are complementarily combined, and a pixel matrix circuit constituted by NTFTs are integrally formed on the same substrate.

The logic circuit is a signal processing circuit having functions different from those of a driving circuit typified by a shift register or the like, and is a general term of a circuit for performing such signal processing as is conventionally carried out by an external IC, such as a D/A converter circuit, a memory circuit, a $\gamma$ correction circuit, a calculation processing circuit, and the like.

First, in accordance with the manufacturing steps explained by using FIGS. 2A to 2E, steps up to the gettering step of the catalytic element are ended. Then active layers 603 to 605made of only lateral growth regions are formed. Reference numeral 603 denotes the active layer of the PTFT of the CMOS circuit, 604 denotes the active layer of the NTFT of the CMOS circuit, and 605 denotes the active layer of the pixel matrix circuit, and adjustment is made so that the thickness of each layer becomes 30 nm.

In this embodiment, a crystallized glass 601 has the composition of $SiO_2$: 65%, $Al^2O_3$: 25%, MgO: 10%, and $ZrO_2$: 10%. This crystallized glass 601 has a feature that it is transparent. Reference numeral 602 denotes a silicon oxide film obtained by thermal oxidation of an amorphous silicon film, and the thickness thereof is 400 nm.

Figure 6A:
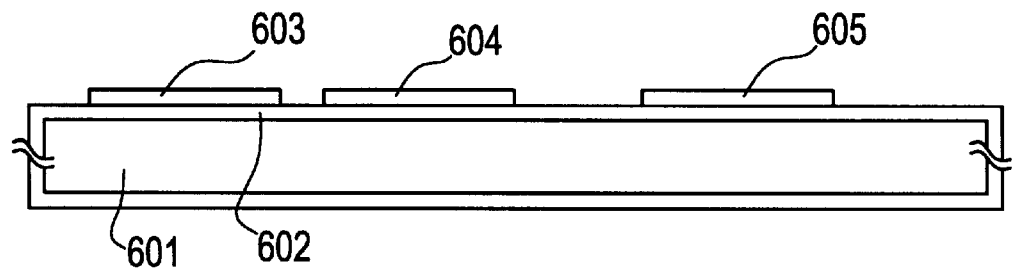
FIGS. 6A to 6D are views showing manufacturing steps of a thin film transistor.

In this way, the state of FIG. 6A is obtained. Next, a gate insulating film 606 made of a silicon oxide film and having a thickness of 120 nm is formed. A silicon nitride oxide film or a silicon nitride film may be used. Further, it is also possible to adopt a lamination structure by freely combining these insulating films.

After the gate insulating film 606 is formed, in the same state, a thermal oxidation step is carried out within a temperature range of 800 to 1000° C. (preferably 900 to 950° C.). At this time, since a thermal oxidation reaction progresses at an interface between the active layer and the gate insulating film, the active layer is made thin, and the thickness of the gate insulating film is increased. This structure is effective in preventing breakdown of the gate insulating film due to an edge thinning phenomenon (phenomenon in which a thermal oxidation film becomes extremely thin at an end of an active layer).

At this time, although an atmosphere of the heat treatment may be an oxidizing atmosphere, if the heat treatment is carried out in an atmosphere containing a halogen element (typically, hydrogen chloride), the heat treatment becomes more effective. This is because it is conceivable that chlorine (Cl) produced by decomposition of hydrogen chloride has an effect of decreasing an interfacial level between the active layer and the gate insulating film.

When the heat treatment within the temperature range of 800 to 1000° C. is carried out, the film quality of the gate insulating film itself is improved.

Figure 6B:
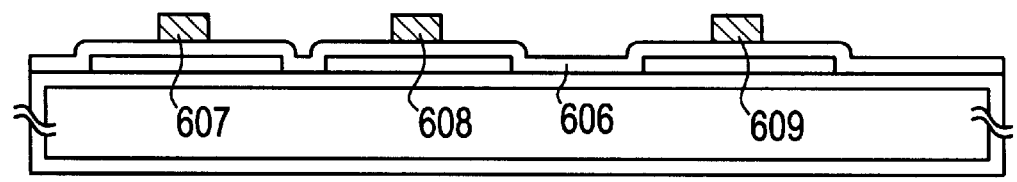

Next, gate electrodes 607 to 609 made of crystalline silicon film showing N-type conductivity are formed on the gate insulating film 606. It is appropriate that the thickness of the gate electrodes 607 to 609 is selected within the range of 200 to 300 nm (FIG. 6B).

After the gate electrodes 607 to 609 are formed, the gate insulating film 606is etched with the gate electrodes 607 to 609 as masks by a dry etching method. In this embodiment, a $CHF_3$ gas is used for etching the silicon oxide film.

This step forms such a state that the gate insulating film remains at only a portion just under the gate electrode (and gate wiring). Of course, part remaining under the gate electrode is the part which actually functions as the gate insulating film.

Figure 6C:
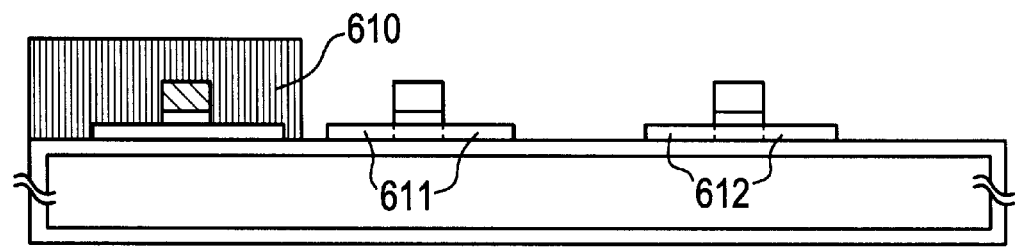

Next, a region which becomes the PTFT is concealed with a resist mask 610, and an impurity (in this embodiment, phosphorus) giving an N type is added by an ion implantation method or a plasma doping method. Since part of low concentration impurity regions 611 and 612 formed at this time subsequently becomes an LDD (Lightly Doped Drain) region, phosphorus with a concentration of $1 \times 10^{17}$ to $5 \times 10^{18}$ atoms/cm$^3$ is added (FIG. 6C).

Next, after the resist mask 610 is removed, a region which becomes the NTFT is concealed with a resist mask 613, and an impurity (in this embodiment, boron) for giving a P type is added by an ion implantation method or a plasma doping method. Also at this time, a low concentration impurity region 614 is formed similarly to the case of phosphorus (FIG. 6D).

Figure 6D:
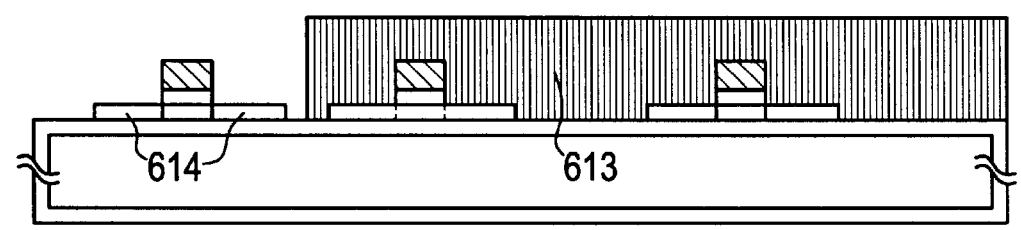

After the state shown in FIG. 6D is obtained in this way, the resist mask 613 is removed, and then, side walls 615 to 617 are formed by using an etch back method. In this embodiment, the side walls 615 to 617 are formed by using silicon nitride films.

In the case where the silicon oxide film is used as a material of the side wall, if the thickness of the silicon oxide film 602 for protecting the side surface of the crystallized glass 601 is thin, there can occur a case where the film disappears in the etch back step. Since the side surface of the glass is sufficiently smaller than the total area, the outflow of glass constituents does not become a serious problem. However, it is effective that the thickness of the silicon oxide film 602 is made thick in advance so that it remains even after the etch back step.

After the side walls 615 to 617 are formed in this way, the region which becomes the PTFT is again concealed with a resist mask 618, and phosphorus is added. At this time, the dosage is made higher than the previous adding step.

Figure 7A:
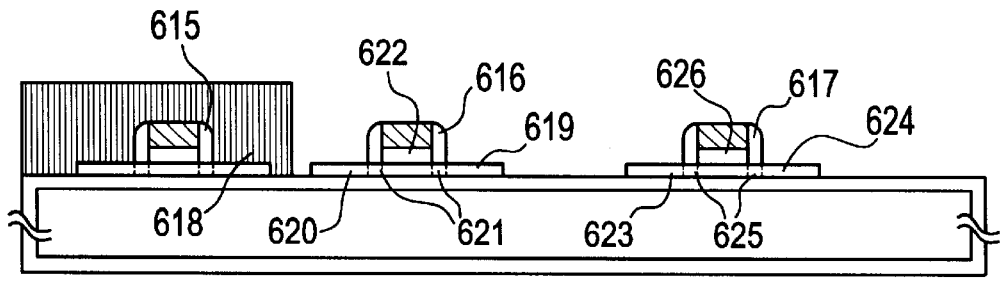
FIGS. 7A to 7C are views showing manufacturing steps of a thin film transistor.

By the adding step of phosphorus, a source region 619, a drain region 620, a low concentration impurity region (LDD region) 621, and a channel formation region 622 of the NTFT constituting the CMOS circuit are defined. Moreover, a source region 623, a drain region 624, a low concentration impurity region (LDD region) 625, and a channel formation region 626 of the NTFT constituting the pixel matrix circuit are defined (FIG. 7A).

Figure 7B:
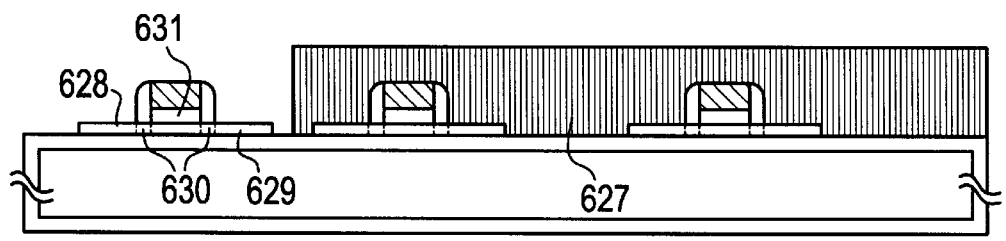

Next, after the resist mask 618 is removed, the region which becomes the NTFT is concealed with a resist mask 627, and boron with a dosage higher than the previous step is added. By this adding step of boron, a source region 628, a drain region 629, a low concentration impurity region (LDD region) 630, and a channel formation region 631 of the PTFT constituting the CMOS circuit are defined (FIG. 7B).

After the adding steps of impurities into the active layer are ended in the manner described above, a heat treatment is carried out by furnace annealing, laser annealing, or lamp annealing, so that the added impurities are activated. At this time, damages given to the active layer at the addition of impurities are also recovered.

The channel formation regions 622, 626, and 631 are not added with any impurity element and are intrinsic or substantially intrinsic regions. Here, the phrase "substantially intrinsic" means that the concentration of an impurity giving an N type or a P type is not higher than the spin density of the channel formation region, or the concentration of the impurity is within the range of $1 \times 10^{14}$ to $1 \times 10^{17}$ atoms/cm$^3$.

Next, a first interlayer insulating film 632 made of lamination films of a silicon nitride film with a thickness of 25 nm and a silicon oxide film with a thickness of 900 nm is formed. Then source electrodes 633 to 635, and drain electrode 636 and 637 made of lamination films of Ti/Al/Ti (in this order, the thickness is 100/500/100 nm) are formed.

Next, a second interlayer insulating film made of a lamination structure of a silicon nitride film 638 with a thickness of 50 nm, a silicon oxide film (not shown) with a thickness of 20 nm, and a polyimide film 639 with a thickness of 1 μm is formed. Instead of polyimide, other organic resin film of acryl, polyamide, or the like may be used. The silicon oxide film with a thickness of 20 nm in this case functions as an etching stopper when the polyimide film 639 is dry-etched.

After the second interlayer insulating film is formed, the polyimide film 639 is etched at a region where auxiliary capacitance is subsequently formed, so that an opening portion is provided. At this time, only the silicon nitride film 638 is made to remain on the bottom of the opening portion or both the silicon nitride film 638 and the silicon oxide film (not shown) are made to remain.

Then a titanium film with a thickness of 300 nm is formed, and patterning is carried out to form a black mask 640. This black mask 640 is disposed over the pixel matrix circuit and a portion which requires shading, such as a TFT and a wiring portion.

At this time, in the foregoing opening portion, the drain electrode 637 of the pixel matrix circuit is positioned near the black mask 640 through the intervening silicon nitride film 638 (or the lamination film of the silicon nitride film and the silicon oxide film). In this embodiment, the black mask 640 is kept at a fixed potential, and an auxiliary capacitance 641 including the drain electrode 637 as a lower electrode and the black mask 640 as an upper electrode is formed. In this case, since the dielectric is very thin and the relative dielectric constant is high, large capacitance can be secured.

After the black mask 640 and the auxiliary capacitance 641 are formed in this way, a polyimide film with a thickness of 1 μm is formed to make a third interlayer insulating film 642. Then a contact hole is formed, and a pixel electrode 643 having a thickness of 120 nm and made of a transparent conductive film (typically ITO) is formed.

Figure 7C:
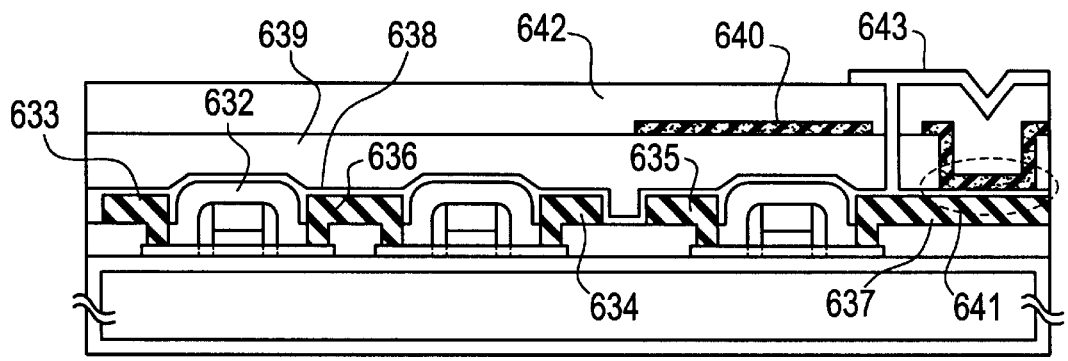

Finally, a heat treatment in a hydrogen atmosphere is carried out at 350° C. for about two hours to hydrogenate the entire of the component. In this way, an active matrix substrate as shown in FIG. 7C is completed. Subsequently, when a liquid crystal layer is held between the active matrix substrate and an opposite substrate by a well-known cell assembling step, an active matrix type liquid crystal display device (transmission type) is completed.

The structure of the active matrix substrate is not limited to this embodiment, but any structure may be adopted. That is, as long as the structure satisfies the structural conditions of the present invention, a user can freely design a TFT structure, a circuit arrangement, and the like.

For example, although the transparent conductive film is used as the pixel electrode in this embodiment, if this film is changed to a material having high reflectivity, such as an aluminum alloy film, a reflection type active matrix liquid crystal display device can be easily realized. In this case, it is not necessary that the crystallized glass as the base of the active matrix substrate is transparent, but a shading substrate may be used.

Embodiment 3

In this embodiment, an example in which an insulating silicon film for protecting crystallized glass in the structure of Embodiment 1 is formed by a low pressure CVD method, will be described.

First, as a substrate, crystallized glass having the composition of $SiO_2$: 52.5, $Al_2O_3$: 26.5, MgO: 11.9, $TiO_2$: 11.4 is prepared. This is non-alkaline cordierite-based crystallized glass using $TiO_2$ as a nucleus forming agent.

Next, a silicon nitride oxide film is formed on the front surface, the back surface, and the side surface of the crystallized glass. In this embodiment, the silicon nitride oxide film is formed by a low pressure CVD method using silane ($SiH_4$) and nitrous oxide ($N_2O$) as a film forming gas.

In this case, a film forming temperature is 800 to 850° C. (in this embodiment, 850° C.), and the flow rates of the respective film forming gases are made $SiH_4$: 10 to 30 sccm and $N_2O$: 300 to 900 sccm. It is appropriate that the reaction pressure is made 0.5 to 1.0 torr.

If silane and nitrogen dioxide ($NO_2$) or nitrogen monoxide (NO) is used as the film forming gas, it is also possible to form a silicon nitride oxide film at a temperature of 600 to 650° C. In that case, the reaction pressure is made 0.1 to 1.0 torr, and the flow rates of the respective gases are made $SiH_4$: 10 to 30 sccm and $NO_2$ or NO: 300 to 900 sccm.

In the case of this embodiment, since the silicon nitride oxide film is formed by the low pressure CVD method, the entire surface of the crystallized glass is covered with the insulating film. If the distortion point of the crystallized glass is 850° C. or less, it is possible to take countermeasures against shrinkage at the same time as the film formation.

If the film forming gas is made different, it is also possible to form a silicon nitride film as the protective film of the crystallized glass. In that case, it is appropriate that dichlorsilane ($SiH_2Cl_2$) of 40 to 50 sccm and ammonia ($NH_3$) of 200 to 250 sccm are used as the film forming gases, the film forming temperature is made 750 to 800° C. and the reaction pressure is made 0.1 to 0.5 torr.

Although the silicon nitride film is the most suitable insulating film for blocking the outflow of glass constituents, since its stress is strong, it has been unsuitable for a primer film of a TFT. However, in the present invention, since the silicon nitride film is formed at least on the front surface and the back surface of the crystallized glass, the stresses of the silicon nitride film at the back and the front of the substrate cancel each other out, so that a warp or the like of the substrate does not occur.

Embodiment 4

Figure 8:
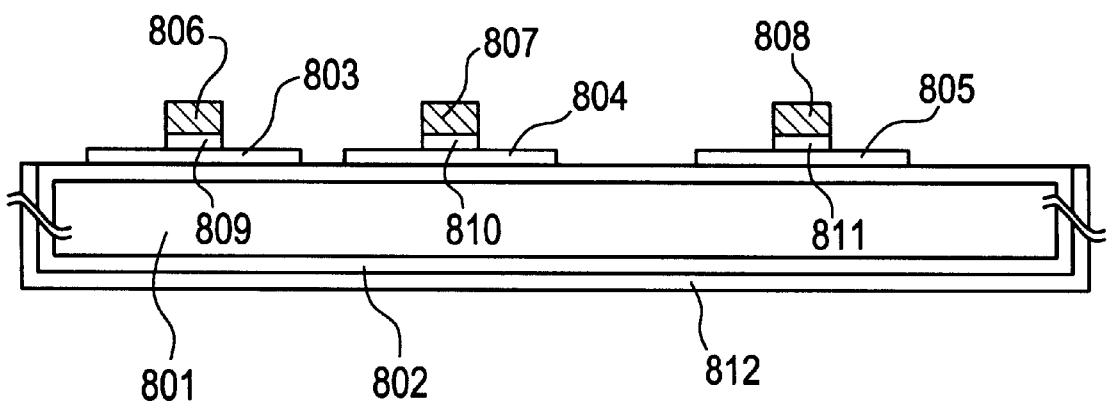
FIG. 8 is a view showing the structure of a thin film transistor.

In this embodiment, an example in which an insulating silicon film formed by a low pressure CVD method is used as a gate insulating film in Embodiments 1 to 3, will be described. FIG. 8 is used for explanation. FIG. 8 shows the state immediately after a gate insulating film has been etched since a gate electrode was formed.

In FIG. 8, reference numeral 801 denotes crystallized glass, and 802 denotes a silicon nitride oxide film which becomes a protective film (primer film) for preventing the outflow of constituents from the crystallized glass. Active layers 803 to 805 are formed at the surface side of the crystallized glass 801, and after the gate insulating film is formed, gate electrodes 806 to 808 are formed.

Dry etching is carried out by using the gate electrodes 806 to 808 as masks so that the gate insulating films 809 to 811 remain just under the gate electrodes.

The most important structure of this embodiment is to use the insulating silicon film (in this embodiment, silicon nitride oxide film) formed by the low pressure CVD method as the gate insulating film. That is, the feature is that the gate insulating film is also formed on all of the front surface, the back surface, and the side surface of the crystallized glass 801.

Thus, at the point of time (state of FIG. 8) when the etching step of the gate insulating film (silicon nitride oxide film) is ended, the film on the front surface side of the substrate is completely removed except the portions which are masked with the gate electrodes, and the silicon nitride oxide film 812 remains as it is on the back surface and the side surface of the substrate. Although the silicon nitride oxide film formed on the side surface is removed according to conditions, there is no problem even if the film on the side surface is removed.

If the structure of this embodiment is used, even if the back surface and the side surface are exposed to an etchant or etching gas which can etch the silicon nitride oxide film in a subsequent step, it is possible to make the silicon nitride oxide film 802, which was directly formed on the crystallized glass 801, remain. That is, it is possible to thoroughly prevent the outflow of constituents from the glass substrate.

Embodiment 5

Although the crystalline silicon film showing N type conductivity is used as the gate electrode in Embodiments 1 and 2, any material may be used as long as the material has conductivity. Especially, in the case where a liquid crystal display device for direct viewing is manufactured, since the area of a pixel matrix circuit becomes large, it is preferable to use a material having low wiring resistance.

In such a case, it is preferable to use aluminum or material mainly containing aluminum as the gate electrode. In this embodiment, an aluminum film containing scandium of 2 wt % is used as the gate electrode.

In the case where the material mainly containing aluminum is used as the gate electrode, it is appropriate that a technique set forth in Japanese Patent Application Laid-Open No. Hei. 7-135318 by the present inventors be used. In the publication, instead of the side wall used in Embodiment 1, an anodic oxidation film obtained by anodic oxidation of the gate electrode is used.

When aluminum or material mainly containing aluminum is used as the gate electrode as in this embodiment, it becomes possible to form gate wiring with low wiring resistance, and an active matrix substrate having high response speed can be manufactured.

This embodiment can be combined with structures of Embodiments 1 to 4.

Embodiment 6

In Embodiments 1 and 2, it is effective to add an impurity element for controlling a threshold voltage (Vth) into an active layer. Although it has been already described that such an element can be added at the film formation of an amorphous semiconductor thin film, it is sufficient if the element be added into at least a channel formation region, so that the element may be added anytime before formation of a gate electrode.

In the case where the element is added at a time other than the film formation, it is possible to use such means as addition by an ion implantation method or a plasma doping method, addition by diffusion from a vapor phase, or addition by diffusion from a solid phase. According to these means, selective addition is possible, for example, added impurities can be made different between an NTFT and a PTFT, so that these means would be effective.

As the added impurity element, when Vth is moved to a plus side, an element in group 13 (boron, gallium, or indium) is used, and when Vth is moved to a minus side, an element in group 15 (phosphorus, arsenic, or antimony) is used.

This embodiment may be combined with structures of Embodiments 1 to 5.

Embodiment 7

Although the explanation has been made in Embodiments 1 to 6 by using a top gate type TFT (planar type TFT) as an example, the structure of the present invention can be applied to a bottom gate type TFT (typically, reverse stagger type TFT) by using CGS. In this embodiment, an example in which the structure of the present invention is applied to the reverse stagger type TFT, will be described with reference to FIG. 9.

Figure 9:
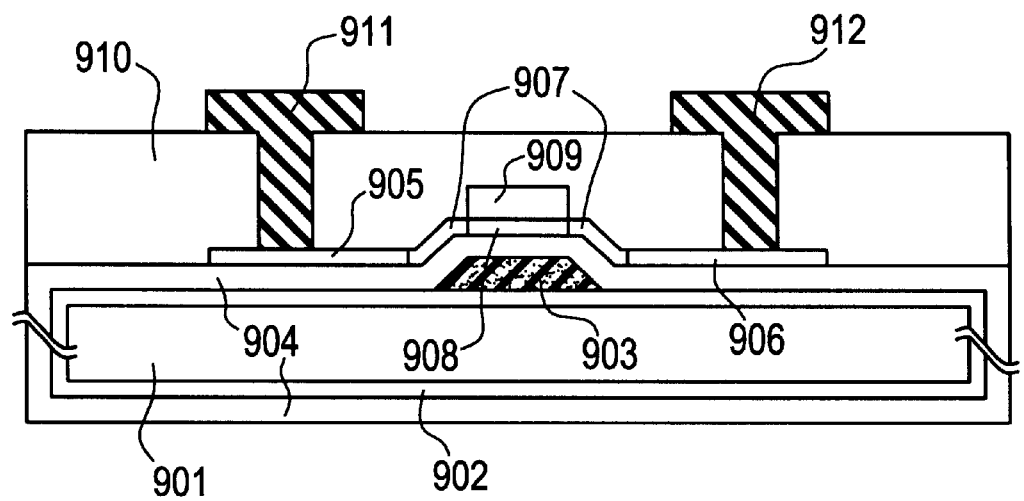
FIG. 9 is a view showing the structure of a thin film transistor.

In FIG. 9, reference numeral 901 denotes crystallized glass, 902 denotes a silicon oxide film obtained by thermal oxidation of an amorphous silicon film, which is formed so as to cover the entire surface of the substrate. Reference numeral 903 denotes a gate electrode in which tantalum (Ta) and tantalum nitride (TaN) are laminated.

In the case of this embodiment, since a gettering process of a catalytic element to an active layer is carried out after the gate electrode 903 is formed, a material having heat resistance so as to be capable of resistance to a heating process exceeding 700° C. is used for the gate electrode 903. As such a material, in addition to tantalum, there may be enumerated chromium, tungsten, molybdenum, and crystalline silicon film having conductivity.

Next, a gate insulating film 904 is formed on the gate electrode 903. In this embodiment, a silicon nitride oxide film is formed by a low pressure CVD method to be made the gate insulating film. Thus, the gate insulating film 904 is formed not only on the front surface of the substrate but also on the back surface and the side surface of the substrate, so that the film covers the entire of the substrate.

An active layer constituted by a source region 905, a drain region 906, a low concentration impurity region (LDD region) 907, and a channel formation region 908 is formed on the gate insulating film 904. In the case of this embodiment, the source/drain regions are formed by an ion implantation method or a plasma doping method. Of course, addition may be carried out by diffusion using a vapor phase method or a solid phase method.

Reference numeral 909 denotes a channel protective film, which is formed of an insulating silicon film. In the case of this embodiment, the channel protective film 909 not only protects the channel formation region 908 but also is utilized as a doping mask for forming the source/drain regions and the low concentration impurity region.

Specifically, the channel protective film is first formed on a portion which becomes the low concentration impurity region and the, channel formation region, and an impurity is added by using the channel protective film as a mask so that the source/drain regions are formed. Thereafter, the channel protective film is removed except a part on the portion which becomes the channel formation region, and the low concentration impurity region is formed by subsequent impurity addition.

After the impurity addition into the active layer is ended, a thermal annealing step is carried out by using one of furnace annealing, laser annealing, and lamp annealing or combination of those, so that the impurity is activated. At that time, the channel protective film 909 remaining as it is even after the impurity addition step was carried out has an effect of preventing the impurity from diffusing into the channel formation region from the source/drain regions or the low concentration impurity region.

Next, as an interlayer insulating film 910, an acrylic film with a thickness of 2 $\mu$m is formed. Of course, other organic resin films such as polyimide may be used. In this case, the channel protective film 909 prevents the direct contact between the interlayer insulating film 910 made of the acrylic film and the channel formation region 908, so that the film can block the change of TFT characteristics due to organic pollution.

A contact hole is formed in the interlayer insulating film 910, a source electrode 911 and a drain electrode 912 made of a material containing aluminum as the main ingredient are formed, and finally, hydrogenating is carried out so that the reverse stagger type TFT as shown in FIG. 9 is completed.

Although only the manufacturing steps of a single body of the reverse stagger type TFT have been described in this embodiment, since it is easy to constitute a CMOS circuit or a pixel matrix circuit with the reverse stagger type TFT of this embodiment when referring to the manufacturing steps of Embodiment 1, the explanation will be omitted.

Thus, it is easy to complete an active matrix substrate by using reverse stagger type TFTs such as shown in this embodiment and to realize an active matrix type liquid crystal display device.

Embodiment 8

Although the explanation has been made in Embodiments 1 to 6 by using a top gate type TFT (planar type TFT) as an example, the structure of the present invention can be applied to a bottom gate type TFT (typically, a reverse stagger type TFT) by using a high temperature polysilicon. In this embodiment, an example in which the structure of the present invention is applied to the reverse stagger type TFT will be described with reference to FIG. 10.

Figure 10:
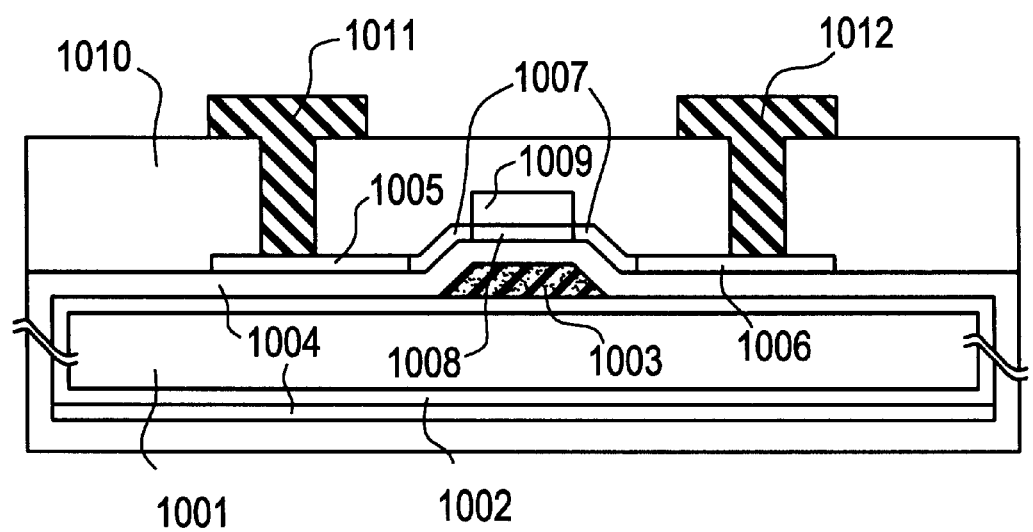
FIG. 10 is a view showing the structure of a thin film transistor.

In FIG. 10, reference numeral 1001 denotes crystallized glass, and 1002 denotes a silicon oxide film obtained by thermal oxidation of an amorphous silicon film, which is formed so as to cover the entire surface of the substrate. Reference numeral 1003 denotes a gate electrode in which tantalum (Ta) and tantalum nitride (TaN) are laminated.

In the case of this embodiment, a material having heat resistance so as to be capable of resistance to a heating process at a temperature exceeding at least 750° C. is used for the gate electrode 1003. As such a material, other than tantalum, there are enumerated, chromium, tungsten, molybdenum, and crystalline silicon film having conductivity.

Next, a gate insulating film 1004 is formed on the gate electrode 1003. In this embodiment, a silicon nitride oxide film is formed by a low pressure CVD method to be made the gate insulating film. Thus, the gate insulating film 1004 is formed not only on the front surface of the substrate but also on the back surface and the side surface of the substrate, so that the film covers the entire of the substrate.

An active layer constituted by a source region 1005, a drain region 1006, a low concentration impurity region (LDD region) 1007, and a channel formation region 1008 is formed on the gate insulating film 1004. In the case of this embodiment, the source/drain regions are formed by an ion implantation method or a plasma doping method. Of course, addition may be carried out by diffusion using a vapor phase method or a solid phase method.

Reference numeral 1009 denotes a channel protective film, which is made of an insulating silicon film. In the case of this embodiment, the channel protective film 1009 not only protects the channel formation region 1008 but also is utilized as a doping mask for forming the source/drain regions and the low concentration impurity region.

Specifically, the channel protective film is first formed on a portion which becomes the low concentration impurity region and the channel formation region, and an impurity is added by using the channel protective film as a mask so that the source/drain regions are formed. Thereafter, the channel protective film is removed except a part on the portion which becomes the channel formation region, and the low concentration impurity region is formed by subsequent impurity addition.

After the impurity addition into the active layer is ended, a thermal annealing step is carried out by using one of furnace annealing, laser annealing, and lamp annealing or combination of those, so that the impurity is activated. At that time, the channel protective film 1009 remaining as it is even after the impurity addition step was carried out has an effect of preventing the impurity from diffusing into the channel formation region from the source/drain regions or the low concentration impurity region.

Next, as an interlayer insulating film 1010, an acrylic film with a thickness of 2 μm is formed. Of course, other organic resin films such as polyimide may be used. In this case, the channel protective film 1009 prevents the direct contact between the interlayer insulating film 1010 made of the acrylic film and the channel formation region 1008, so that the film can block the change of TFT characteristics due to organic pollution.

Then contact holes are formed in the interlayer insulating film 1010, a source electrode 1011 and a drain electrode 1012 made of a material containing aluminum as the main ingredient are formed, and finally, hydrogenating is carried out so that the reverse stagger type TFT as shown in FIG. 10 is completed.

Although only the manufacturing steps of a single body of the reverse stagger type TFT have been described in this embodiment, since it is easy to constitute a CMOS circuit or a pixel matrix circuit with the reverse stagger type TFT of this embodiment when referring to the manufacturing steps of Embodiment 1, the explanation will be omitted.

Thus, it is easy to complete an active matrix substrate by using reverse stagger type TFTs such as shown in this embodiment and to realize an active matrix type liquid crystal display device.

Embodiment 9

In the step shown in FIG. 2E, although the heat treatment in the atmosphere containing the halogen element is carried out as the gettering means of the catalytic element, in this embodiment, an example in which the catalytic element is removed by another means will be described with reference to FIGS. 11A to 11C.

Figure 11A:
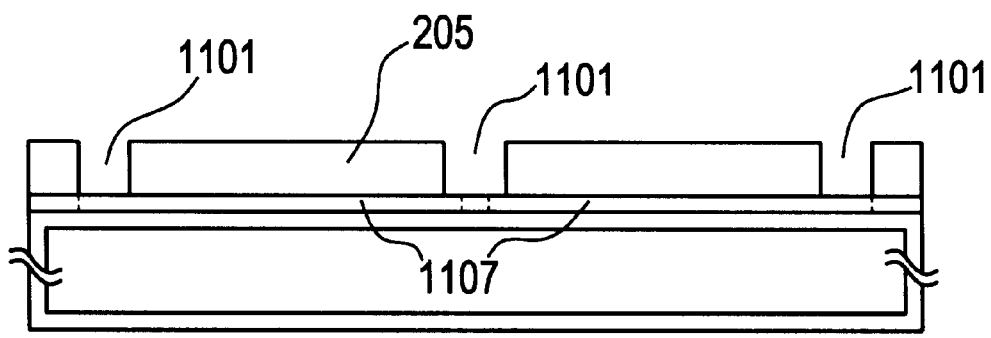
FIGS. 11A to 11C are views showing manufacturing steps of a thin film transistor.
Figure 11B:
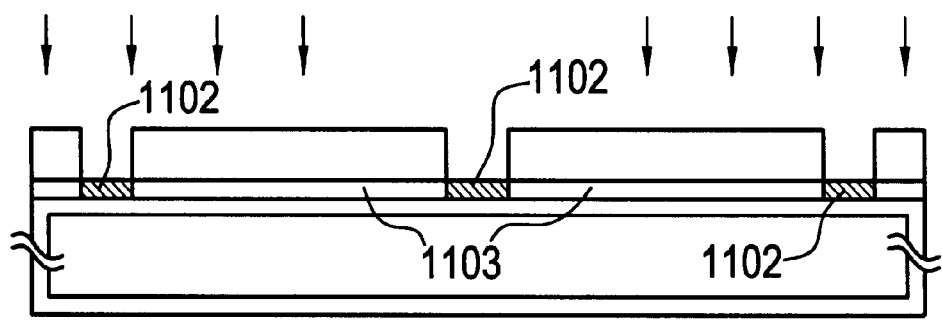

After the steps of FIGS. 2A to 2D are ended, the mask insulating film 205 is again patterned to form new opening portions 1101 (FIG. 11A).

Next, an element (in this embodiment, phosphorus) selected from group 15 is added. It is appropriate that the concentration of the addition at this time be $1 \times 10^{19}$ to $1 \times 10^{21}$ atoms/cm$^3$. Here, a plasma doping method is used as a means for adding phosphorus.

By this adding step of phosphorus, phosphorus with a high concentration is added into regions exposed in the opening portions 1101. In the present specification, the regions 1102 will be referred to as gettering regions. Regions 1103 which are masked with the mask insulating films 205 so that phosphorus was not added will be referred to as gettered regions (FIG. 11B).

Figure 11C:
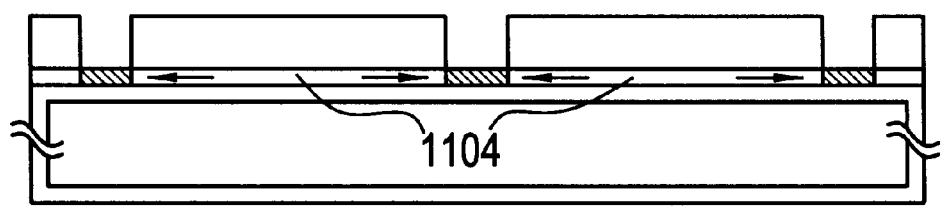

Next, as shown in FIG. 11C, within the temperature range of 600 to 800° C., a heat treatment is carried out for 2 to 24 hours, so that the catalytic elements contained in the gettered regions 1103 are moved into the gettering regions 1102. This is a phenomenon using the gettering effect of phosphorus for a metallic element. If a process temperature is lower than 600° C., the gettering performance is extremely lowered, and if the process temperature exceeds 800° C., phosphorus is reversely diffused into the gettered regions 1103. Thus, such temperature levels are not preferable.

When the catalytic element is captured into the gettering regions 1102 in the manner as described above, the concentration of the catalytic element remaining after the process in the gettered regions 1104 is lowered to $5 \times 10^{17}$ atoms/cm$^3$ or less. Subsequently, it is satisfactory if the gettering regions are completely removed by etching when an active layer is formed.

The structure of this embodiment can be combined with any structure of Embodiments 1 to 10. Even if the manufacturing steps of this embodiment are used, the foregoing CGS film can be formed.

Embodiment 10

In Embodiments 1 and 2, although the manufacturing steps of a planar type TFT having an offset structure has been described, a planar type TFT having an LDD structure may be adopted. In that case, for example, a technique set forth in Japanese Patent Application Laid-Open No. Hei. 6-265940 may be used, or other well-known methods may be used for the formation of the TFT.

The structure of this embodiment can be combined with any structure of Embodiments 1 to 4 or 6.

Embodiment 11

Figure 12A:
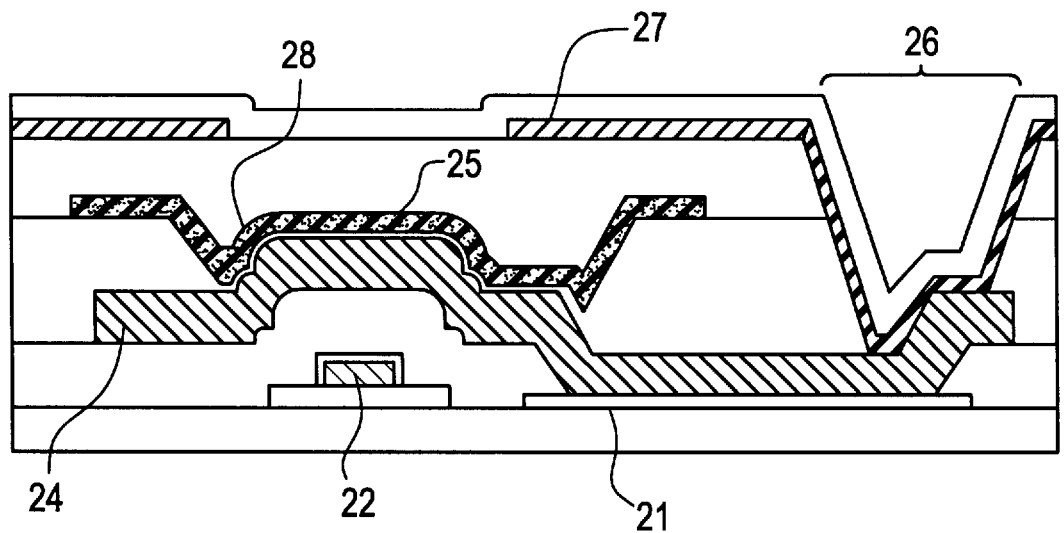
FIGS. 12A and 12B are views showing an upper surface and a sectional structure of a pixel TFT.
Figure 12B:
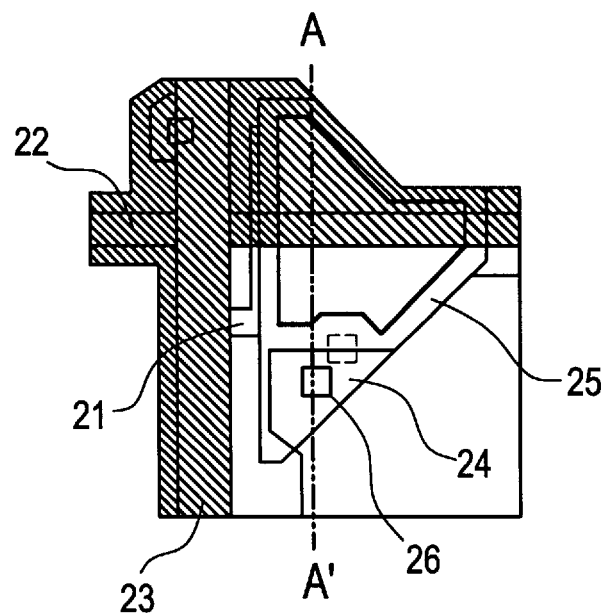

In this embodiment, the pixel structure of the active matrix substrate shown in FIG. 6C will be described more specifically. FIG. 12A is a view showing a sectional structure of a pixel TFT and FIG. 12B is a top view thereof. In FIGS. 12A and 12B, reference numeral 21 denotes an active layer, 22 denotes a gate line, 23 denotes a source line, 24 denotes a drain electrode, 25 denotes a black mask, and 26 denotes a contact hole for connecting the drain electrode 24 to a pixel electrode 27.

The feature of this embodiment is to form an auxiliary capacitance over the pixel TFT and between the drain electrode 24 and the black mask 25.

FIG. 12B shows the structure of the pixel TFT viewed from above. Incidentally, FIG. 12A corresponds to a sectional view of FIG. 12B taken along line A–A'. Common reference characters are used in FIGS. 12A and 12B.

Like this, the drain electrode 24 is formed in such an arrangement that it overlaps with the gate line 22, and an auxiliary capacitance is formed between the drain electrode 24 and a black mask 25 opposite thereto through an intervening dielectric 28. In this embodiment, as the drain electrode 24, a three-layer structure in which a titanium film is sandwiched between aluminum films is adopted.

In the case of this embodiment, after the drain electrode 24 is formed, an interlayer insulating film made of a three-layer structure of a silicon nitride film/silicon oxide film/acrylic film is formed, and the black mask 25 is formed thereon.

At this time, before formation of the black mask 25, only the acrylic film at a region which subsequently becomes the auxiliary capacitance is removed to form an opening portion. Then, only the silicon oxide film and the silicon nitride film remain on the bottom of the opening portion, and an insulating layer made of this two-layer structure functions as the dielectric 28 of the auxiliary capacitance.

Embodiment 12

Figure 13:
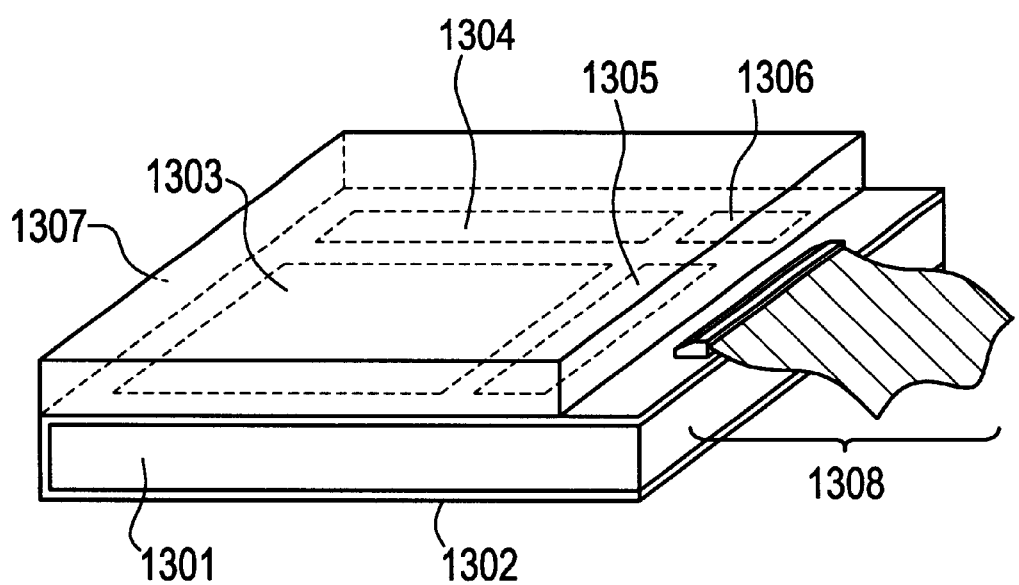
FIG. 13 is a view showing a structure of a liquid crystal module.

FIG. 13 shows an example in which a liquid crystal display device is constructed by employing an active matrix substrate ,utiiizing TFTs with the use of CGS, having the structure shown in Embodiment 2, 4, 5, 6, 7, 9, or 11. FIG. 13 shows a portion corresponding to the main body of the liquid crystal display device, which is also called a liquid crystal module.

In FIG. 13, reference numeral 1301 denotes crystallized glass, and 1302 denotes an insulating silicon film formed so as to cover the entire surface of the crystallized glass. In the case where a plurality of active matrix substrates are made by cutting from a large substrate in a multiple-chamfered manner, although the insulating silicon film does not exist on the side surface that is a cut surface, the insulating silicon film remains on other side surfaces than the above, which is the feature of the present invention. Of course, since the substrate is completed as the active matrix substrate, even if it is not protected with the insulating silicon film, there is no fear that the constituents may be flown out.

On the substrate of such structure, a plurality of TFTs are formed of semiconductor thin films having the feature that crystal grain boundaries do not substantially exist. These TFTs constitute on the substrate a pixel matrix circuit 1303, a gate side driving circuit 1304, a source side driving circuit 1305, and a logic circuit 1306. An opposite substrate 1307 is bonded to such an active matrix substrate. A liquid crystal layer (not shown) is held between the active matrix substrate and the opposite substrate 1307.

In the structure shown in FIG. 13, it is desirable that all sides of the active matrix substrate are flush with all sides of the opposite substrate except one side. By this, the number of products obtained from a large substrate can be effectively increased. In the above-mentioned one side, a part of the opposite substrate is removed so that a part of the active matrix substrate is exposed, and an FPC (Flexible Print Circuit) 1308 is attached thereto. As the need arises, an IC chip (semiconductor circuit constituted by MOSFETs formed on single crystal silicon) may be mounted thereon.

Since the TFT including an active layer of the semiconductor thin film used in the present invention has an extremely high operation speed, it is possible to integrally form a signal processing circuit driven at a high frequency of several hundreds MHz to several GHz on the same substrate as a pixel matrix circuit. That is, the liquid crystal module shown in FIG. 13 materializes a system-on-panel.

Although this embodiment shows an example in which the present invention is applied to the liquid crystal display device, it is also possible to form an active matrix type EL (electroluminescence) display device or the like. It is also possible to form an image sensor or the like having a photoelectric conversion layer on the same substrate.

Incidentally, the electrooptical device is defined as a device having functions for converting an electric signal into an optical signal or for converting an electric signal into an optical signal, such as the foregoing liquid crystal display device, the EL display device, and the image sensor. The present invention can be applied to any electrooptical device as long as the device can be formed by using a semiconductor thin film on a substrate having an insulating surface.

Embodiment 13

Figure 14A:
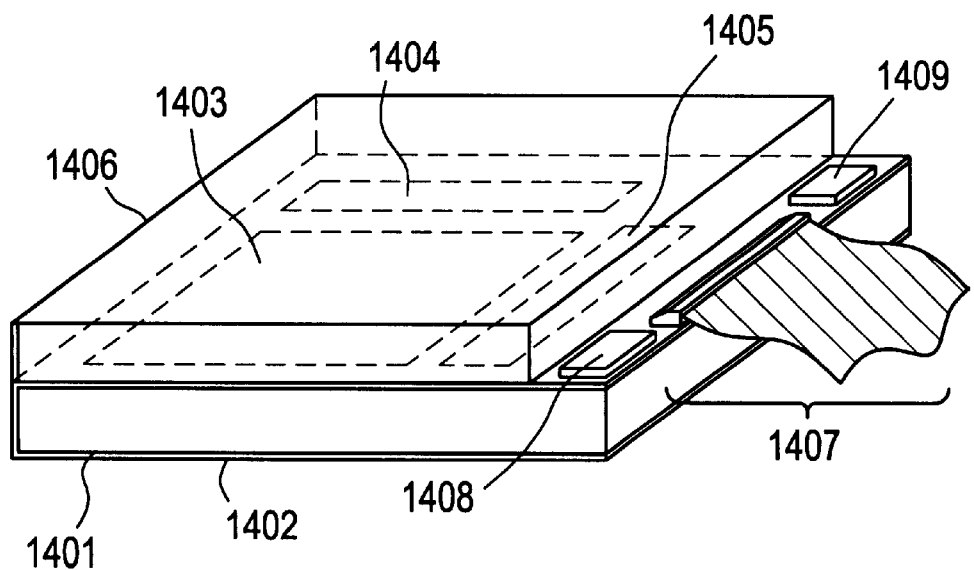
FIGS. 14A and 14B are views showing the structure of a liquid crystal module, respectively.
Figure 14B:
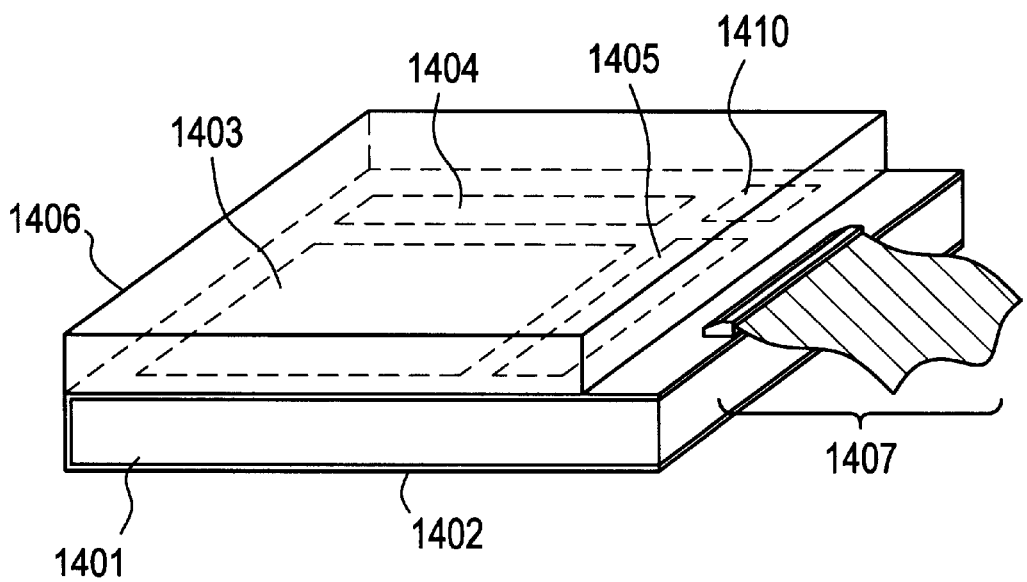

An example in which a liquid crystal display device is constructed by employing an active matrix substrate using TFTs having the structure shown in Embodiment 1, 3, 4, 5, 6, 8, 10, or 13 and using high temperature polysilicon, will be described with reference to FIGS. 14A and 14B. FIGS. 14A and 14B respectively, show a portion corresponding to the main body of the liquid crystal display device, which is also called a liquid crystal module.

In FIG. 14A, reference numeral 1401 denotes crystallized glass, and 1402 denotes an insulating silicon film formed on the entire surface of the crystallized glass. In the case where a plurality of active matrix substrates are made by cutting from a large substrate in a multiple-chamfered manner, although the insulating silicon film does not exist on the side surface that is a cut surface, the insulating film remains on other side surfaces than the above, which is the feature of the present invention. Of course, since the substrate is completed as the active matrix substrate, even if it is not protected with the insulating silicon film, there is no fear that the constituents may be flown out.

On the substrate of such structure, a plurality of TFTs are formed of polycrystal silicon films (high temperature polysilicon films) formed by using high temperature annealing. These TFTs constitute on the substrate a pixel matrix circuit 1403, a gate side driving circuit 1404, and a source side driving circuit 1405. An opposite substrate 1406 is bonded to such an active matrix substrate. A liquid crystal layer (not shown) is held between the active matrix substrate and the opposite substrate 1406.

In the structure shown in FIG. 14A, it is desirable that all sides of the active matrix substrate are made flush with all sides of the opposite substrate except one side. By this, it is possible to effectively increase the number of multiple-chamfers cut from a large substrate. In the above-mentioned one side, a part of the opposite substrate is removed so that a part of the active matrix substrate is exposed, and an FPC (Flexible Print Circuit) 1407 is attached thereto.

In FIG. 14A, IC chips (semiconductor circuits constituted by MOSFETs formed on single crystal silicon) 1408 and 1409 are mounted by effectively using the space where the FPC 1407 is attached. These IC chips 1408 and 1409 carry out signal processing (digital/analog conversion, storing of information, γ correction, and the like) necessary for driving the liquid crystal module.

As shown in FIG. 14B, it is also possible to carry out signal processing, such as processing performed by the IC chips 1408 and 1409 in FIG. 14A, by a logic circuit 1410 formed of TFTs on the same substrate. Since the high temperature polysilicon film is very excellent in crystallinity, it is possible to form a circuit having a high operation speed, such as a logic circuit. That is, the liquid crystal module shown in FIG. 14B materializes a system-on-panel.

Although this embodiment shows an example in which the present invention is applied to the liquid crystal display device, it is also possible to form an active matrix type EL (electroluminescence) display device. It is also possible to form an image sensor or the like having a photoelectric conversion layer on the same substrate.

Incidentally, the electrooptical device is defined as a device having functions for converting an optical signal into an electric signal or for converting an electric signal into an optical signal, such as the foregoing liquid crystal display device, the EL display device, and the image sensor. The present invention can be applied to any electrooptical device as long as the device can be formed by using a semiconductor thin film on a substrate having an insulating surface.

Embodiment 14

In the present invention, not only the electrooptical device as shown in Embodiments 12 and 13 but also a thin film integrated circuit (or semiconductor circuit) in which functional circuits are integrated, may be formed. For example, it is also possible to form a calculation circuit such as a microprocessor, a high frequency circuit (MMIC: Microwave Module IC) for a portable equipment, or the like.

Moreover, by using the merits of a TFT using a thin film, it is also possible to form a semiconductor circuit of a three-dimensional structure to form a VLSI circuit integrated with ultra high density. Like this, it is possible to form a semiconductor circuit having extremely added functionality by using the TFTs of the present invention. Incidentally, in the present specification, the semiconductor circuit is defined as an electric circuit for controlling and converting electric signals by using semiconductor characteristics.

Embodiment 15

In this embodiment, examples of electronic equipments (applied products) having an electrooptical device or a semiconductor circuit shown in Embodiments 12 to 14 will be described with reference to FIGS. 15A to 15F. Incidentally, the electronic equipment is defined as a product having a semiconductor circuit and/or an electrooptical device.

As the electronic equipments to which the present invention can be applied, a video camera, an electric still camera, a projector, a head mount display, a car navigation system, a personal computer, a portable information terminal (mobile computer, portable telephone, PHS (Person Handyphone System), etc.) and the like are enumerated.

Figure 15A:
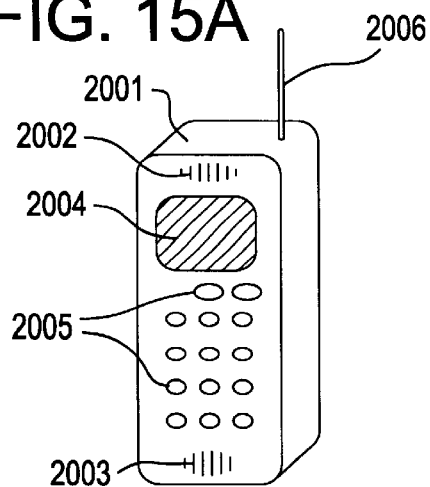
FIGS. 15A to 15F are views showing the structure of an electronic equipment, respectively.

FIG. 15A shows a portable telephone which is constituted by a main body 2001, an audio output portion 2002, an audio input portion 2003, a display device 2004, an operation switch 2005, and an antenna 2006. The present invention can be applied to the audio output portion 2002, the audio input portion 2003, the display device 2004, and the like.

Figure 15B:
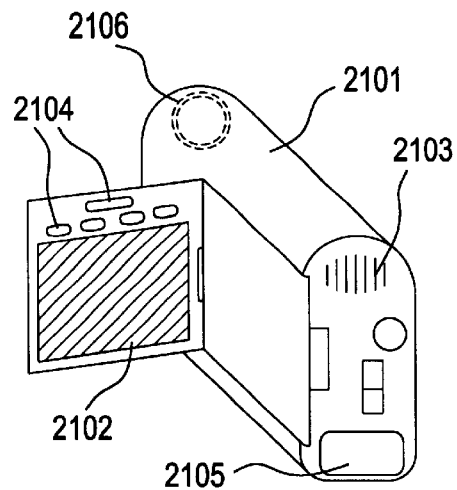

FIG. 15B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, the image receiving portion 2106, and the like.

Figure 15C:
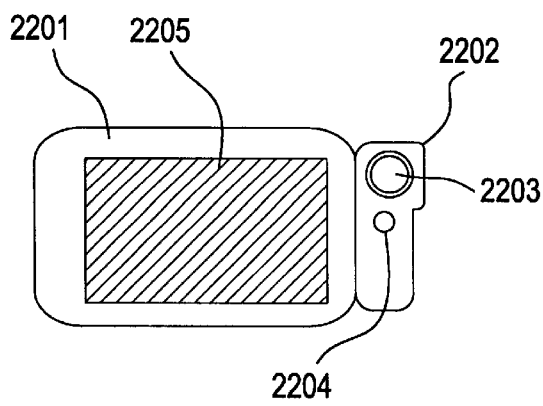

FIG. 15C shows a mobile computer which is constituted by a main body 2201, a camera portion 2202, an image receiving portion 2203, an operation switch 2204, and a display device 2205. The present invention can be applied to the camera portion 2202, the image receiving portion 2203, the display device 2205, and the like.

Figure 15D:
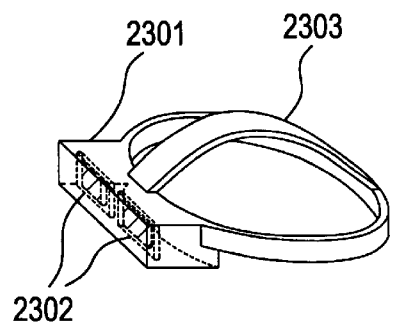

FIG. 15D shows a head mount display which is constituted by a main body 2301, a display device 2302, and a band portion 2303. The present invention can be applied to the display device 2302.

Figure 15E:
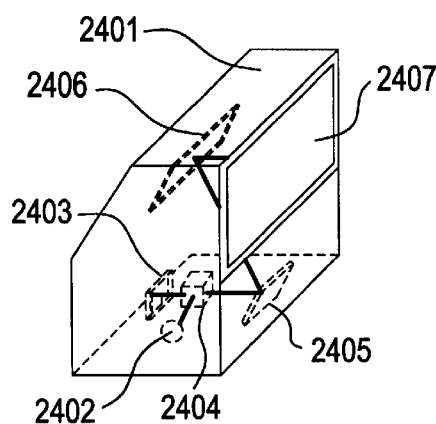

FIG. 15E shows a rear type projector which is constituted by a main body 2401, a light source 2402, a display device 2403, a polarizing beam splitter 2404, reflectors 2405 and 2406, and a screen 2407 The present invention can be applied to the display device 2403.

Figure 15F:
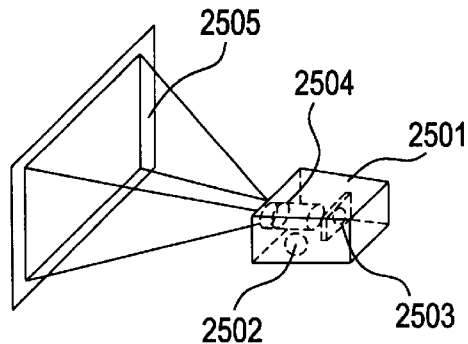

FIG. 15F shows a front type projector which is constituted by a main body 2501, a light source 2502, a display device 2503, an optical system 2504, and a screen 2505. The present invention can be applied to the display device 2503.

As described above, the scope of an application of the present invention is very wide, and the present invention can be applied to electronic equipments of any field. Moreover, the present invention can be applied to any product as long as it requires an electrooptical device or a semiconductor circuit.

The present invention adopts such structure that crystallized glass which is inexpensive and made large is used, and at least the front surface and the back surface (preferably the entire surface) of the glass are protected by insulating silicon films in order to utilizing the crystallized glass with safety (without fear of pollution).

Then a TFT using a semiconductor thin film with a unique crystal structure excellent in conformity of crystal grain boundaries is manufactured on the crystallized glass, so that a system-on-panel is realized and an electrooptical device or a semiconductor circuit with high performance, and further, an electronic equipment having them can be provided at low cost.

What is claimed is:

1. A method of manufacturing a semiconductor device, said method comprising the steps of:

forming a first amorphous semiconductor film comprising silicon over a front surface and a back surface of a glass substrate having a distortion point of not lower than 750° C.;

carrying out a first heat treatment to oxidize the first amorphous semiconductor film to form a first thermal oxidation film;

forming a second amorphous semiconductor film comprising silicon over the first thermal oxidation film formed over the front surface of the glass substrate;

providing the second amorphous semiconductor film with a catalytic element for facilitating crystallization of the second amorphous semiconductor film;

carrying out a second heat treatment to crystallize the second amorphous semiconductor film to form a crystalline semiconductor film;

gettering the catalytic element from the crystalline semiconductor film; and patterning the crystalline semiconductor film after the gettering step to form an active layer and to form a second thermal oxidation film on a surface of the active layer.

2. A method according to claim 1,
wherein the glass substrate is a crystallized glass substrate.

3. A method according to claim 1,
wherein the distortion point of the glass substrate is in a range of 950 to 1100° C.

4. A method according to claim 1, wherein the crystalline semiconductor film is a silicon film.

5. A method according to claim 1,
wherein a heat treatment is carried out in an atmosphere containing a halogen element at a temperature exceeding 700° C. in the gettering step.

6. A method according to claim 1,
wherein the gettering step further comprises the steps of:
selectively adding an impurity element selected from group 15 into a part of the crystalline semiconductor thin film; and moving the catalytic element remaining in a first region where the impurity element was not added into a second region where the impurity element was added by a heat treatment.

7. A method according to claim 1, wherein the catalytic element comprises at least one selected from the group consisting of Ni, Ge, Co, Fe, Pd, Pt, Cu, Au, and Pb.

8. A method according to claim 1, wherein the first semiconductor film is an amorphous silicon film.

9. A method according to claim 1, wherein the first semiconductor film is formed over all surface of the glass substrate.

10. A method according to claim 1, wherein the first semiconductor film is completely transformed into the first thermal oxidation film by the first heat treatment.

11. A method according to claim 1, wherein the first semiconductor film is formed through a low pressure CVD method.

12. A method according to claim 1, wherein the second semiconductor film further comprises germanium.

13. A method according to claim 1, wherein the semiconductor device is in combination with an electronic equipment, wherein the electronic equipment is one selected from the group consisting of a portable telephone, a video camera, a mobile computer, a head mount display, a rear type projector, a front type projector.

14. A method according to claim 1, wherein the second amorphous semiconductor film is an amorphous silicon film.

15. A method of manufacturing a semiconductor device, said method comprising the steps of:
forming a first amorphous semiconductor film comprising silicon over a front surface and a back surface of a glass substrate having a distortion point of not lower than 750° C.;
carrying out a first heat treatment to oxidize the first amorphous semiconductor film to form a thermal oxidation film;
forming a second amorphous semiconductor film comprising silicon over the thermal oxidation film formed over the front surface of the glass substrate;
carrying out a second heat treatment to crystallize the second amorphous semiconductor film to form a crystalline semiconductor film; and
patterning the crystalline semiconductor film to form an active layer.

16. A method according to claim 15, wherein the glass substrate is a crystallized glass substrate.

17. A method according to claim 15, wherein the distortion point of the glass substrate is in a range of 950 to 1100° C.

18. A method according to claim 15, wherein the crystalline semiconductor film is a silicon film.

19. A method according to claim 15, wherein the first amorphous semiconductor film is an amorphous silicon film.

20. A method according to claim 15, wherein the first semiconductor film is formed over all surfaces of the glass substrate.

21. A method according to claim 15, wherein the first semiconductor film is completely transformed into the thermal oxidation film by the first heat treatment.

22. A method according to claim 15, wherein the first semiconductor film is formed through a low pressure CVD method.

23. A method according to claim 15, wherein the second semiconductor film further comprises germanium.

24. A method according to claim 15, wherein the semiconductor device is in combination with an electronic equipment, wherein the electronic equipment is one selected from the group consisting of a portable telephone, a video camera, a mobile computer, a head mount display, a rear type projector, a front type projector.

25. A method according to claim 15, wherein the second amorphous semiconductor film is an amorphous silicon film.

26. A method of manufacturing an electroluminescent display device, said method comprising the steps of:
forming a first amorphous semiconductor film comprising silicon over a front surface and a back surface of a glass substrate having a distortion point of not lower than 7500° C.;
carrying out a first heat treatment to oxidize the first amorphous semiconductor film to form a first thermal oxidation film;
forming a second amorphous semiconductor film comprising silicon over the first thermal oxidation film formed over the front surface of the glass substrate;
providing the second amorphous semiconductor film with a catalytic element for facilitating crystallization of the second amorphous semiconductor film;
carrying out a second heat treatment to crystallize the second amorphous semiconductor film to form a crystalline semiconductor film;
gettering the catalytic element from the crystalline semiconductor film: and
patterning the crystalline semiconductor film after the geftering step to form an active layer and to form a second thermal oxidation film on a surface of the active layer.

27. A method according to claim 26, wherein the glass substrate is a crystallized glass substrate.

28. A method according to claim 26, wherein the distortion point of the glass substrate is in a range of 950 to 1100° C.

29. A method according to claim 26, wherein the crystalline semiconductor film is a silicon film.

30. A method according to claim 26, wherein a heat treatment is carried out in an atmosphere containing a halogen element at a temperature exceeding 700° C. in the gettering step.

31. A method according to claim 26, wherein the gettering step further comprises the steps of:
selectively adding an impurity element selected from group 15 into a part of the crystalline semiconductor film; and
moving the catalytic element remaining in a first region where the impurity element was not added into a second region where the impurity element was added by a heat treatment.

32. A method according to claim 26, wherein the catalytic element comprises at least one selected from the group consisting of Ni, Ge, Co, Fe, Pd, Pt, Cu, Au, and Pb.

33. A method according to claim 26, wherein the first amorphous semiconductor film is an amorphous silicon film.

34. A method according to claim 26,
wherein the first semiconductor film is formed over all surfaces of the glass substrate.

35. A method according to claim 26,
wherein the first semiconductor film is completely transformed into the first thermal oxidation film by the first heat treatment.

36. A method according to claim 26,
wherein the first semiconductor film is formed through a low pressure CVD method.

37. A method according to claim 26, wherein the second semiconductor film further comprises germanium.

38. A method according to claim 26,
wherein the electroluminescent display device is in combination with an electronic equipment,
wherein the electronic equipment is one selected from the group consisting of a portable telephone, a video camera, a mobile computer, a head mount display, a rear type projector, a front type projector.

39. A method according to claim 26, wherein the second amorphous semiconductor film is an amorphous silicon film.

40. A method of manufacturing an electroluminescent display device, said method comprising the steps of;
forming a first amorphous semiconductor film comprising silicon over a front surface and a back surface of a glass substrate having a distortion point of not lower than 750° C.:
carrying out a first heat treatment to oxidize the first amorphous semiconductor film to form a thermal oxidation film:
forming a second amorphous semiconductor film comprising silicon over the thermal oxidation film formed over the front surface of the glass substrate;
carrying out a second heat treatment to crystallize the second amorphous semiconductor film to form a crystalline semiconductor film; and
patterning the crystalline semiconductor film to form an active layer.

41. A method according to claim 40,
wherein the glass substrate is a crystallized glass substrate.

42. A method according to claim 40,
wherein the distortion point of the glass substrate is in a range of 950 to 1100° C.

43. A method according to claim 40, wherein the crystalline semiconductor film is a silicon film.

44. A method according to claim 40, wherein the first amorphous semiconductor film is an amorphous silicon film.

45. A method according to claim 40,
wherein the first semiconductor film is formed over all surfaces of the glass substrate.

46. method according to claim 40,
wherein the first semiconductor film is completely transformed into the thermal oxidation film by the first heat treatment.

47. A method according to claim 40,
wherein the first semiconductor film is formed through a low pressure CVD method.

48. A method according to claim 40, wherein the second semiconductor film further comprises germanium.

49. A method according to claim 40,
wherein the electroluminescent display device is in combination with an electronic equipment,
wherein the electronic equipment is one selected from the group consisting of a portable telephone, a video camera, a mobile computer, a head mount display, a rear type projector, a front type projector.

50. A method according to claim 40, wherein the second amorphous semiconductor film is an amorphous silicon film.

* * * * *